US00RE43819E

(19) United States
(12) Reissued Patent
Lim et al.

(10) Patent Number: US RE43,819 E
(45) Date of Reissued Patent: Nov. 20, 2012

(54) THIN FILM TRANSISTOR ARRAY SUBSTRATE AND METHOD OF FABRICATING THE SAME

(75) Inventors: Byoung Ho Lim, Kyongsangbuk-do (KR); Hee Chun Boo, legal representative, Kyongsangbuk-do (KR); Hyun Sik Seo, Gyeonggi-do (KR); Heung Lyul Cho, Gyeonggi-do (KR); Hong Sik Kim, Seoul (KR)

(73) Assignee: LG Display Co., Ltd., Seoul (KR)

(21) Appl. No.: 12/461,266

(22) Filed: Aug. 5, 2009

Related U.S. Patent Documents

Reissue of:
(64) Patent No.: 7,279,370
Issued: Oct. 9, 2007
Appl. No.: 10/958,260
Filed: Oct. 6, 2004

(30) Foreign Application Priority Data

Oct. 11, 2003 (KR) ..... 10-2003-0070836
Dec. 11, 2003 (KR) ..... 10-2003-0090285

(51) Int. Cl.
*H01L 21/00* (2006.01)
*H01L 29/00* (2006.01)

(52) U.S. Cl. ..... 438/155; 438/30; 438/48; 438/149; 438/158; 257/56; 257/57; 257/59; 257/72; 257/E21.56; 257/E21.703; 257/E27.111; 349/38; 349/43; 349/138; 349/149

(58) Field of Classification Search ..... 438/30, 438/48, 149, 155, 158; 257/56, 57, 59, 72, 257/E21.56, E21.703, E27.111; 349/38, 349/43, 138, 149; H01L 21/00, 29/00
See application file for complete search history.

(56) References Cited

U.S. PATENT DOCUMENTS

| | | | |
|---|---|---|---|
| 6,255,130 | B1 | 7/2001 | Kim |
| 6,335,276 | B1 | 1/2002 | Park et al. |
| 6,586,286 | B2 | 7/2003 | Park et al. |
| 6,798,477 | B2 | 9/2004 | Yoo et al. |
| 7,019,797 | B2 | 3/2006 | Choi et al. |
| 2002/0109799 | A1 | 8/2002 | Choi et al. |
| 2004/0055997 | A1 | 3/2004 | Park et al. |

FOREIGN PATENT DOCUMENTS

| | | |
|---|---|---|
| CN | 1 254 948 | 5/2000 |
| CN | 1 255 740 | 6/2000 |
| JP | 2002-098995 | 4/2002 |
| KR | 2002-0078010 | 10/2002 |
| KR | 2002-095997 | 12/2002 |
| KR | 2003-58614 | 7/2003 |

*Primary Examiner* — Dao H Nguyen
(74) *Attorney, Agent, or Firm* — Morgan, Lewis & Bockius LLP

(57) ABSTRACT

A thin film transistor array substrate device includes a gate line formed on a substrate, a data line crossing the gate line with a gate insulating pattern position therebetween, a thin film transistor at a crossing of the gate line and the data line, a pixel electrode formed at a pixel region defined by the crossing of the gate line and the data line and connected to the thin film transistor, a gate pad part having a lower gate pad electrode connected to the gate line and an upper gate pad electrode connected to the lower gate pad electrode, a data pad part having a lower data pad electrode connected to the date line and an upper data pad electrode connected to the lower data pad electrode, and a passivation film pattern formed at a region besides the region including the pixel electrode, the upper data pad electrode, and the upper gate pad electrode, wherein the pixel electrode is formed on the gate insulating pattern of the pixel region exposed by the passivation film pattern.

25 Claims, 34 Drawing Sheets

THIN FILM TRANSISTOR ARRAY SUBSTRATE AND METHOD OF FABRICATING THE SAME

Matter enclosed in heavy brackets [ ] appears in the original patent but forms no part of this reissue specification; matter printed in italics indicates the additions made by reissue.

The present invention claims the benefit of Korean Patent Application Nos. P2003-70836 and P2003-90285, filed in Korea on Oct. 11, 2003 and Dec. 11, 2003, respectively, which are hereby incorporated by reference.

BACKGROUND OF THE INVENTION

1. Field of the Invention

The present invention relates to an array substrate and a method of fabricating an array substrate, and more particularly, to a thin film transistor (TFT) array substrate and a method of fabricating a TFT array substrate.

2. Description of the Related Art

In general, a liquid crystal display (LCD) device produces an image by adjusting light transmittance of a liquid crystal material using an electric field. The LCD device includes an LCD panel in which liquid crystal cells are arranged in a matrix configuration, and a driving circuit for driving the LCD panel.

The LCD panel includes a TFT array substrate and a color filter (CF) array substrate that face each other, wherein a spacer is located for maintaining a uniform cell gap between the TFT and CF array substrates and a liquid crystal material is provided within the cell gap.

The TFT array substrate includes gate lines and data lines, a TFT formed as a switching device at each intersection of the gate and data lines, a pixel electrode connected to the TFT formed for each of a plurality of liquid crystal cells, and an alignment film applied to each of the liquid crystal cells. The gate lines and the data lines receive signals from the driving circuits through corresponding pad portions. Accordingly, the TFT, in response to a scan signal supplied to a gate line, supplies a pixel voltage signal transmitted along a data line to the pixel electrode.

The CF array substrate includes a color filter formed by the liquid crystal cell, a black matrix that reflects external light and separates each of the color filters, a common electrode commonly supplying a reference voltage to the liquid crystal cells, and an alignment film disposed on each of the liquid crystal cells.

The LCD panel is fabricated by combining the TFT array substrate and the CF array substrate that have been separately manufactured, injecting the liquid crystal material between the TFT and CF array substrates and sealing the TFT and CF array substrates together with the liquid crystal material therebetween.

In the LCD device, since fabrication of the TFT array substrate involves semiconductor processing including a plurality of individual mask processes, the fabrication process for the TFT array substrate is complicated and is a major cost factor in the fabrication costs of the LCD panel. Thus, fabrication of the TFT array substrate has been developed in order to reduce the number of individual mask processes. For example, one mask process includes multiple individual processes, such as thin film deposition, cleaning, photolithography, etching, photo-resist stripping, and inspection processes.

Presently, four-round mask processes have been developed, wherein one mask process is reduced from an existing five-round mask process that is employed as a standard mask process.

FIG. 1 is a plan view of a TFT array substrate according to the related art, and FIG. 2 is a cross sectional view along 1-I' of FIG. 1 according to the related art. In FIGS. 1 and 2, a TFT array substrate includes gate lines 2 and data lines 4 crossing each other and having a gate insulating film 44 therebetween on a lower substrate 42, a TFT 6 formed at each crossing of the gate and data lines 2 and 4, and a pixel electrode 18 formed in a cell region arranged by the crossing of the gate and data lines 2 and 4. In addition, the TFT array substrate includes a storage capacitor 20 formed at an overlapped part of the pixel electrode 18 and a pre-stage gate line 2, a gate pad part 26 connected to the gate line 2, and a data pad part 34 connected to the data line 4.

The TFT 6 includes a gate electrode 8 connected to the gate line 2, a source electrode 10 connected to the data line 4, a drain electrode 12 connected to a pixel electrode 18, and an active layer 14 of semiconductor pattern 47 defining a channel between the source electrode 10 and the drain electrode 12 and overlapping the gate electrode 8. The active layer 14 overlaps a lower data pad electrode 36, a storage electrode 22, the data line 4, the source electrode 10, and the drain electrode 12, and includes a channel portion defined between the source electrode 10 and the drain electrode 12. In addition, an ohmic contact layer 48 of the semiconductor pattern 47 is used for making an ohmic contact with the lower data pad electrode 36, the storage electrode 22, the data line 4, the source electrode 10, and the drain electrode 12, and is further formed on the active layer 14. The TFT 6, in response to the gate signal supplied to the gate line 2, causes a pixel voltage signal supplied to the data line 4 to be charged to and maintained in the pixel electrode 18.

In FIG. 2, the pixel electrode 18 is connected to the drain electrode 12 of the TFT 6 via a first contact hole 16 passing through a passivation film 50. The pixel electrode 18 generates a potential difference along with the common electrode formed on an upper substrate (not shown) by a charged pixel voltage. Due to the potential difference, the liquid crystal material located between the TFT substrate and the upper substrate (not shown) rotates due to a dielectric anisotropy of the liquid crystal material, and transmits incident light through the pixel electrode 18 from a light source (not shown) onto the upper substrate (not shown).

The storage capacitor 20 includes a pre-stage gate line 2, a storage electrode 22 overlapping the pre-stage gate line 2 with the gate insulating film 44, with the active layer 14 and the ohmic contact layer 48 therebetween, and the pixel electrode 18 connected through a second contact hole 24 formed at the passivation film 50 and overlapped with the storage electrode 22 having the passivation film 50 therebetween. The storage capacitor 20 stably maintains the pixel voltage charged to the pixel electrode 18 until a subsequent pixel voltage is charged.

The gate line 2 is connected to a gate driver (not shown) through the gate pad part 26. The gate pad part 26 includes a lower gate pad electrode 28 extending from the gate line 2, and an upper gate pad electrode 32 connected to the lower gate pad electrode 28 via a third contact hole 30 passing through both of the gate insulating film 44 and the passivation film 50. The data line 4 is connected to a data driver (not shown) through the data pad part 34. The data pad part 34 includes the lower data pad electrode 36 extending from the data line 4, and an upper data pad electrode 40 connected to the lower data pad electrode 36 via a fourth contact hole 38 passing through the passivation film 50.

The TFT substrate having the above-described configuration is formed using a four-round mask process.

FIGS. 3A to 3D are cross sectional views along I-I' of FIG. 1 showing a method of fabricating the TFT array substrate of FIG. 2 according to the related art. In FIG. 3A, gate patterns are formed on the lower substrate 42. On the lower substrate 42, a gate metal layer is formed by a deposition method, such as a sputtering. Subsequently, the gate metal layer is then patterned by photolithography using a first mask and an etching process to form the gate patterns including the gate line 2, the gate electrode 8, and the lower gate pad electrode 28. A material for the gate metal layer includes chromium (Cr), molybdenum (Mo), aluminium (Al) and the like, which are used in a form of a single-layer structure or a double-layer structure.

In FIG. 3B, the gate insulating film 44, the active layer 14, the ohmic contact layer 48, and source/drain patterns are sequentially formed on the lower substrate 42 provided with the gate pattern. The gate insulating film 44, an amorphous silicon layer, an $n^+$ amorphous silicon layer, and a source/drain metal layer are sequentially formed on the lower substrate 42 having the gate patterns thereon by a deposition technique, such as plasma enhanced chemical vapor deposition (PECVD) and sputtering.

For example, a photo-resist pattern is formed on the source/drain metal layer by a photolithography process using a second mask. The second mask employs a diffractive exposure mask having a diffractive exposing part, wherein the diffractive exposing part corresponds to a channel portion of the TFT. As a result, a photo-resist pattern of the channel portion has a lower height than a photo-resist pattern of the source/drain pattern part.

Subsequently, the source/drain metal layer is then patterned by a wet etching process using the photo-resist pattern to form source/drain patterns including the data line 4, the source electrode 10, the drain electrode 12, which is integral to the source electrode 10, and the storage electrode 22.

Next, the amorphous silicon layer and the $n^+$ amorphous silicon layer are patterned at the same time by a dry etching process using the same photo-resist pattern to form the semiconductor pattern 47 including the ohmic contact layer 48 and the active layer 14.

The photo-resist pattern having a relatively low height in the channel portion is removed by an ashing process, and the source/drain pattern and the ohmic contact layer 48 of the channel portion are etched by a dry etching process. Accordingly, the active layer 14 of the channel portion is exposed to separate the source electrode 10 from the drain electrode 12. Then, a remainder of the photo-resist pattern left on the source/drain pattern is removed using a stripping process.

The gate insulating film 44 is made of an inorganic insulating material, such as silicon oxide ($SiO_x$ or silicon nitride ($SiN_x$). A metal for the source/drain pattern includes molybdenum (Mo), titanium (Ti), tantalum (Ta), and Mo alloy or the like.

In FIG. 3C, the passivation film 50 including first, second, third, and fourth contact holes 16, 24, 30, and 38 are formed on the gate insulating film 44 having the source/drain patterns. The passivation film 50 is entirely formed on the gate insulating film 44 having the source/drain patterns by a deposition technique, such as a PECVD. Then, the passivation film 50 is patterned by photolithography using a third mask and an etching process to form the first, second, third, and fourth contact holes 16, 24, 30, and 38. The first contact hole 16 is formed to pass through the passivation film 50 and expose the drain electrode 12, whereas the second contact hole 24 is formed to pass through the passivation film 50 and expose the storage electrode 22. The third contact hole 30 is formed to pass through the passivation film 50 and the gate insulating film 44 and expose the lower gate pad electrode 28. The fourth contact hole 38 is formed to pass through the passivation film 50 and expose the lower data pad electrode 36.

The passivation film 50 is made of an inorganic insulating material, such as a material of the gate insulating film 44 or of an organic insulating material having a small dielectric constant, such as an acrylic organic compound, benzocyclobutene (BCB), or perfluorocyclobutane (PFCB).

In FIG. 3D, transparent electrode patterns are formed on the passivation film 50. For example, a transparent electrode material is entirely deposited on the passivation film 50 by a deposition technique, such as a sputtering and the like. Then, the transparent electrode material is patterned by photolithography using a fourth mask and an etching process to provide the transparent electrode patterns including the pixel electrode 18, the upper gate pad electrode 32, and the upper data pad electrode 40. The pixel electrode 18 is electrically connected, via the first contact hole 16, to the drain electrode 12 while being electrically connected, via the second contact hole 24, to the storage electrode 22 overlapping a pre-stage gate line 2. The upper gate pad electrode 32 is electrically connected, via the third contact hole 30, to the lower gate pad electrode 28. The upper data pad electrode 40 is electrically connected, via the fourth contact hole 38, to the lower data pad electrode 36. Accordingly, the transparent electrode material is made of an indium-tin-oxide (ITO), tin-oxide (TO), or an indium-zinc-oxide (IZO).

As described above, the TFT array substrate and the method of fabricating the TFT array substrate uses a four-round mask process, thereby reducing the number of fabrication processes in comparison with the five-round mask process and reducing fabrication costs. However, since the four-round mask process has a relatively complex fabrication process and reduction of the manufacturing costs is limited, further simplification of the fabrication process and further reduction of the manufacturing costs is required.

SUMMARY OF THE INVENTION

Accordingly, the present invention is directed toward a TFT array substrate and method of fabricating a TFT array substrate that substantially obviates one or more of the problems due to limitations and disadvantages of the related art.

An object of the present invention is to provide a TFT array substrate having a simplified structure.

Another object of the present invention is to provide a method of fabricating a TFT array substrate having a simplified fabrication processes.

Another object of the present invention is to provide a TFT array substrate having improved production yield and image quality.

Another object of the present invention is to provide a method of fabricating a TFT array substrate having an improved production yield and image quality.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a thin film transistor array substrate device includes a gate line formed on a substrate, a data line crossing the gate line with a gate insulating pattern position therebetween, a thin film transistor at a crossing of the gate line and the data line, a pixel electrode formed at a pixel region defined by the crossing of the gate line and the data line and connected to the thin film transistor, a gate pad part having a lower gate pad electrode connected to the gate line and an upper gate pad electrode connected to the lower gate pad electrode, a data pad part having a lower data pad electrode connected to the date line and an upper data pad electrode connected to the lower data pad electrode, and a passivation film pattern formed at a region besides the region including the pixel electrode, the upper data pad electrode, and the upper gate pad electrode, wherein the pixel electrode is formed on the gate insulating pattern of the pixel region exposed by the passivation film pattern.

In another aspect, a method of fabricating a thin film transistor array substrate includes forming a gate pattern on a substrate, the gate pattern including a gate electrode of a thin film transistor, a gate line connected to the gate electrode, and a lower gate pad electrode connected to the gate line, forming a gate insulating film on the substrate having the gate pattern, forming a source/drain pattern including a source electrode and a drain electrode of the thin film transistor, a data line connected to the source electrode and a lower data pad electrode connected to the data line, and a semiconductor pattern formed beneath the source/drain pattern there along, and forming a transparent electrode pattern and a passivation film pattern stacked on remaining areas except for areas at which the transparent electrode pattern is formed, wherein the transparent electrode pattern includes a pixel electrode connected to the drain electrode and formed on the gate insulating film, an upper gate pad electrode connected to the lower gate pad electrode, and an upper data pad electrode connected to the lower data pad electrode.

In another aspect, a method of fabricating a thin film transistor substrate includes preparing a transparent substrate, depositing a first metal film on the substrate and then forming a gate line, a gate electrode and a gate pad through a first mask process, sequentially stacking a fist insulating film, an amorphous silicon layer, an $n^+$ amorphous silicon layer and a second metal film on an entire surface of the substrate having the gate electrode and the gate line, and forming a data line vertically crossing the gate line and defining a pixel region together with the gate line, a semiconductor layer having an active layer and an ohmic contact layer, a source/drain electrode, and a data pad through a second mask process, and forming a second insulating film on an entire surface of the substrate having the data line and the source/drain electrode, exposing the first insulating film of the pixel region, the gate pad and the data pad through a third mask process, depositing a transparent conductive film on an upper portion of the first insulating film, the gate pad and the data pad, to thereby form a pixel electrode connected to the drain electrode, a gate connection terminal connected to the gate pad, and a data connection terminal connected to the data pad.

In another aspect, a method of fabricating a thin film transistor array substrate includes preparing a transparent substrate, forming a gate line, a gate electrode, and a gate pad on the substrate, forming a gate insulating film along an entire surface of the substrate having the gate electrode and the gate pad, forming a data line to vertically cross the gate line and defining a pixel region together with the gate line, a semiconductor layer having an active layer and an ohmic contact layer, a source/drain electrode, and a data pad, exposing the gate insulating film formed at each pixel region, forming a passivation film along an entire surface of the substrate having the data line and the source/drain electrode, applying a photo-resist film to an upper portion of the passivation film, forming a photo-resist pattern on the passivation film by using a mask, forming a contact hole exposing each of the gate pad and the data pad by using the photo-resist pattern as a mask for etching, and exposing the gate insulating film of the pixel region, depositing a transparent conductive film along an entire surface of the substrate having the photo-resist pattern, the gate insulating film of the pixel region and the contact hole, removing the photo-resist pattern and the transparent conductive film formed on the photo-resist pattern to form a pixel electrode on the gate insulating film of the pixel region, and forming a gate connection terminal and a data connection terminal respectively connected via the contact hole to the gate pad and the data pad.

It is to be understood that both the foregoing general description and the follow detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
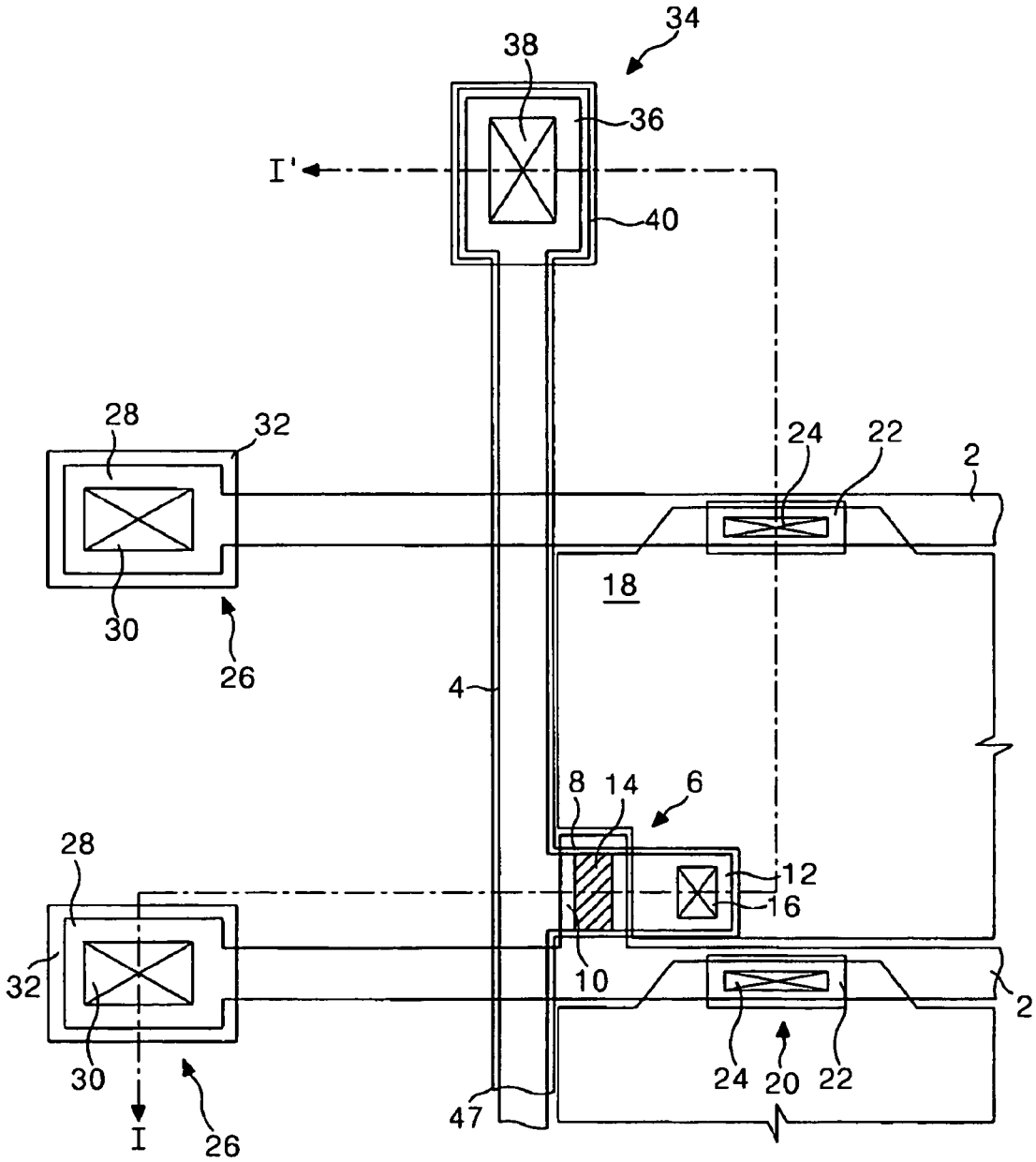
FIG. 1 RELATED ART
FIG. 1 is a plan view of a TFT array substrate according to the related art.
Figure 2:
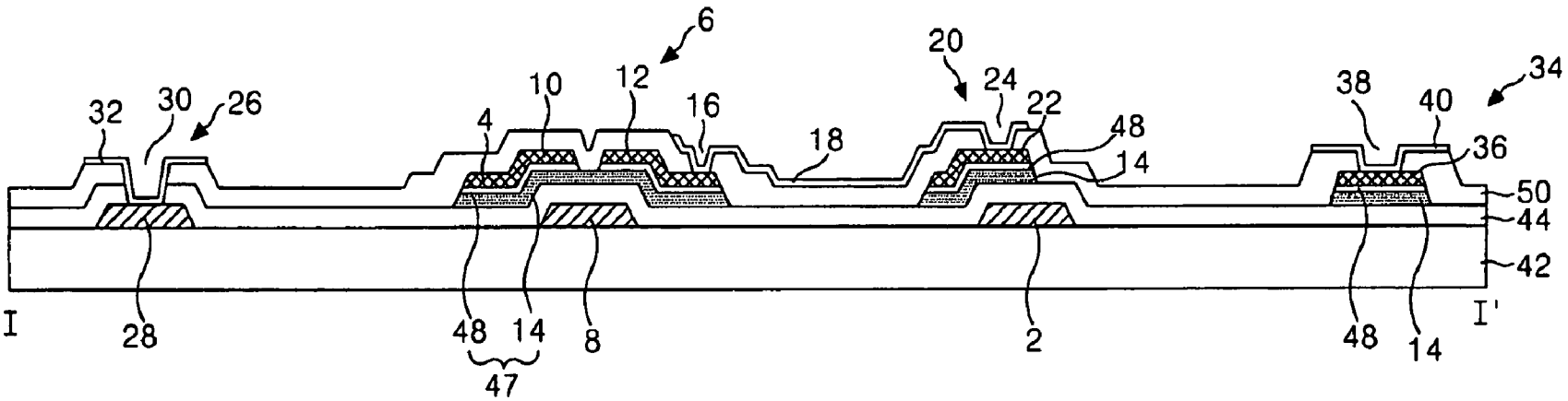
FIG. 2 RELATED ART
FIG. 2 is a cross sectional view along I-I' of FIG. 1 according to the related art.
Figure 3A:
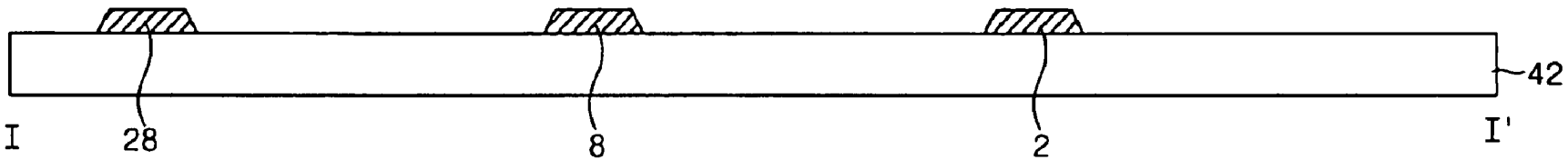
FIG.3A RELATED ART
FIGS. 3A to 3D are cross sectional views along I-I' of FIG. 1 showing a method of fabricating the TFT array substrate of FIG. 2 according to the related art.
Figure 3B:
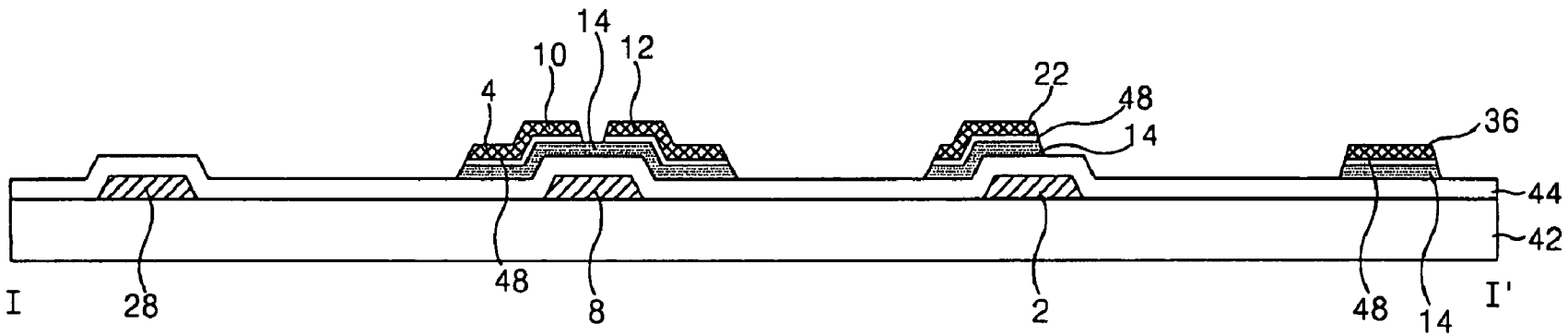
FIG.3B RELATED ART
Figure 3C:
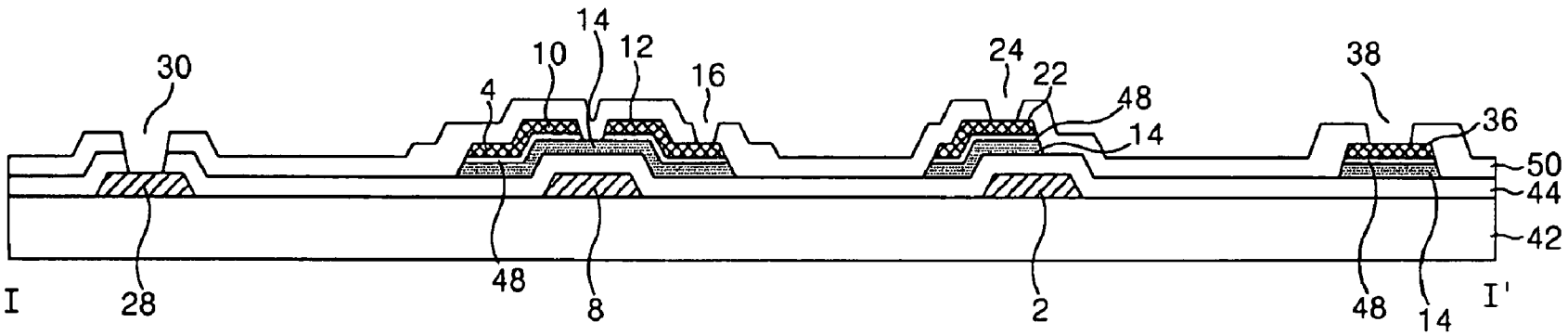
FIG.3C RELATED ART
Figure 3D:
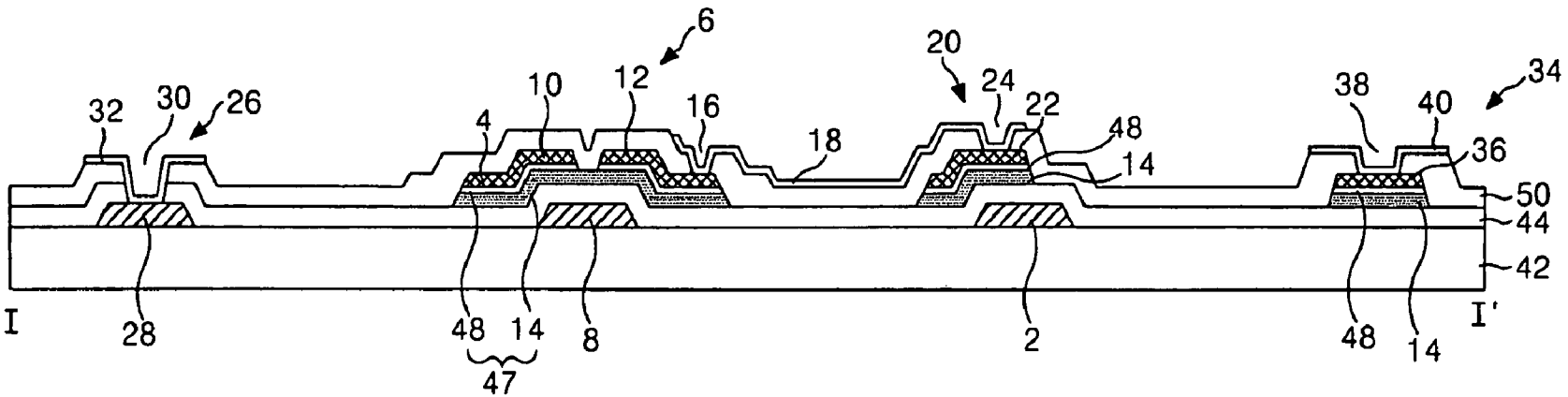
FIG.3D RELATED ART
Figure 4:
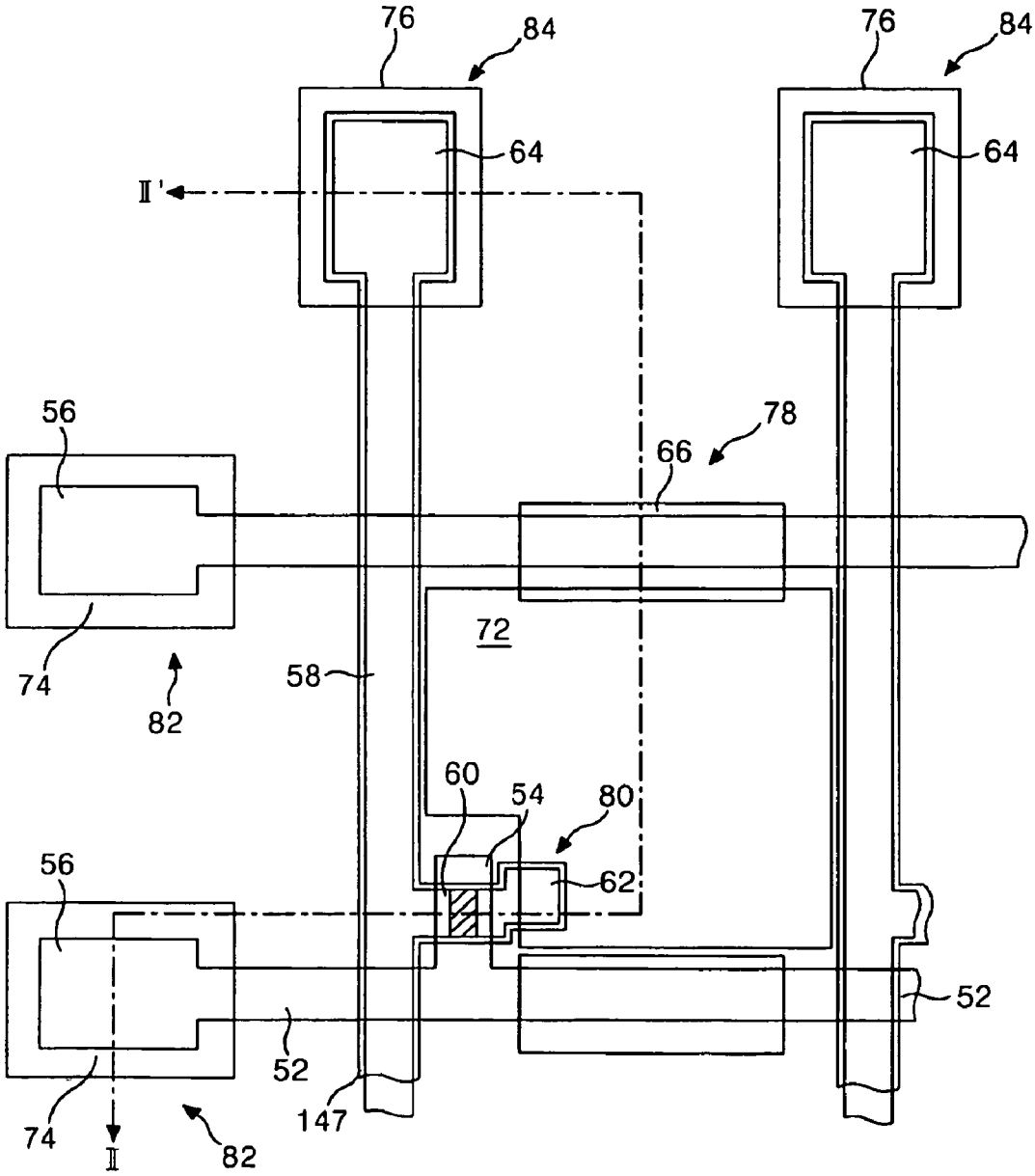
FIG. 4 is a plan view of an exemplary TFT array substrate according to the present invention.
Figure 5:
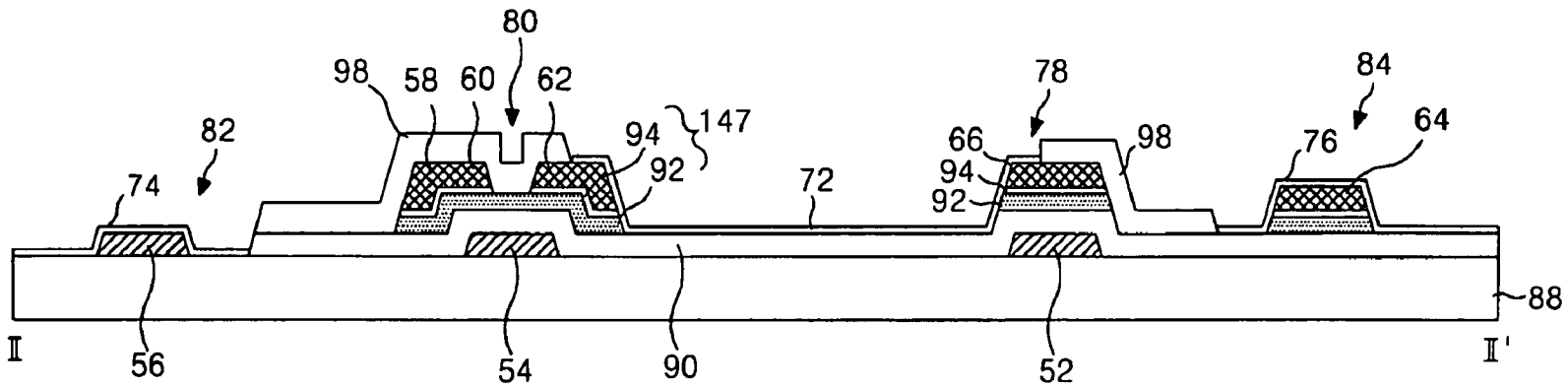
FIG. 5 is a cross sectional view along II-II' of FIG. 5 according to the present invention.

FIG. 4 is a plan view of an exemplary TFT array substrate according to the present invention, and FIG. 5 is a cross sectional view along II-II' of FIG. 5 according to the present invention. In FIGS. 4 and 5, a TFT array substrate may include a gate line 52 and a data line 58 crossing each other, with a gate insulating pattern 90 therebetween, formed on a lower substrate 88, a TFT 80 formed at each crossing of the gate and data lines 52 and 58, a pixel electrode 72 within a pixel region defined by the crossing of the gate and data lines 52 and 58. Furthermore, the TFT array substrate may include a storage capacitor 78 formed at an overlapped portion between a pre-stage gate line 52 and a storage electrode 66 connected to the pixel electrode 72, a gate pad part 82 connected to the gate line 52, and a data pad part 84 connected to the data line 58.

The TFT 80 may include a gate electrode 54 connected to the gate line 52, a source electrode 60 connected to the data line 58, a drain electrode 62 connected to the pixel electrode 72, and a semiconductor pattern 147 including an active layer 92 overlapping the gate electrode 54, with the gate insulating pattern 90 positioned therebetween, thereby forming a channel 70 between the source electrode 60 and the drain electrode 62. The TFT 80 may respond to a gate signal supplied to the gate line 52 to allow the pixel electrode 72 to become charged, and then maintain a pixel voltage signal supplied to the data line 58.

The semiconductor pattern 147 may include the active layer 92 having the channel portion between the source electrode 60 and the drain electrode 62. The active layer 92 may be overlapped with the source electrode 60, the drain electrode 62, the data line 58, and a lower data pad electrode 64. In addition, the active layer 92 may overlap with the storage electrode 66, and may be formed to partially overlap with the gate line 52 with the gate insulating pattern 90 positioned therebetween. The semiconductor pattern 147 may include an ohmic contact layer 94 formed on the active layer 92 for making ohmic contact with the source electrode 60, the drain electrode 62, the storage electrode 66, the data line 58, and the lower data pad electrode 64.

The pixel electrode 72 may be connected to the drain electrode 62 of the TFT 80 exposed to the exterior by a passivation film pattern 98, and may be formed on the gate insulating pattern 90 of the pixel region exposed to the exterior by a passivation film pattern 98. The pixel electrode 72 may generate a potential difference between a common electrode formed on an upper substrate (not shown) by a charged pixel voltage. According to the potential difference, the liquid crystal material located between the TFT substrate and the upper substrate (not shown) may rotate due to dielectric anisotropy of the liquid crystal material and may cause light incident through the pixel electrode 72 from a light source (not shown) to be transmitted to the upper substrate (not shown).

In FIG. 5, the storage capacitor 78 may include a pre-stage gate line 52 and the storage electrode 66, wherein the storage electrode 66 may be overlapped with the pre-stage gate line 52 with the gate insulating pattern 90, the active layer 92, and the ohmic contact layer 94 therebetween. Herein, the pixel electrode 72 may be connected to the storage electrode 66 exposed to the exterior by the passivation film pattern 98. The storage capacitor 78 causes the pixel voltage charged to the pixel electrode 72 to be stably maintained until a subsequent pixel voltage is charged.

The gate line 52 may be connected to a gate driver (not shown) through the gate pad part 82. The gate pad part 82 may include a lower gate pad electrode 56 extending from the gate line 52, and an upper gate pad electrode 74 connected on the lower gate pad electrode 56.

The data line 58 may be connected to a data driver (not shown) through a data pad part 84. The data pad part 84 may include a lower data pad electrode 64 extending from the data line 58, and an upper data pad electrode 76 connected on the lower data pad electrode 64. Furthermore, the data pad part 84 may include the gate insulating pattern 90, the active layer 92, and the ohmic contact layer 94 formed between the lower data pad electrode 64 and the lower substrate 88.

The gate insulating pattern 90 may be formed in a region adjacent to the region where the gate pad part 82 may be formed, and the passivation film pattern 98 may be formed within a region where the pixel electrode 72, the upper gate pad electrode 74, and the upper data pad electrode 76 may not be formed.

The TFT array substrate having such an arrangement may be fabricated using a three-round mask process. The three-round mask process may include a first mask process for forming the gate patterns, a second mask process for forming the semiconductor pattern and the source/drain pattern, and a third mask process for forming the gate insulating pattern 90, the passivation film pattern 98, and the transparent electrode pattern.

Figure 6A:
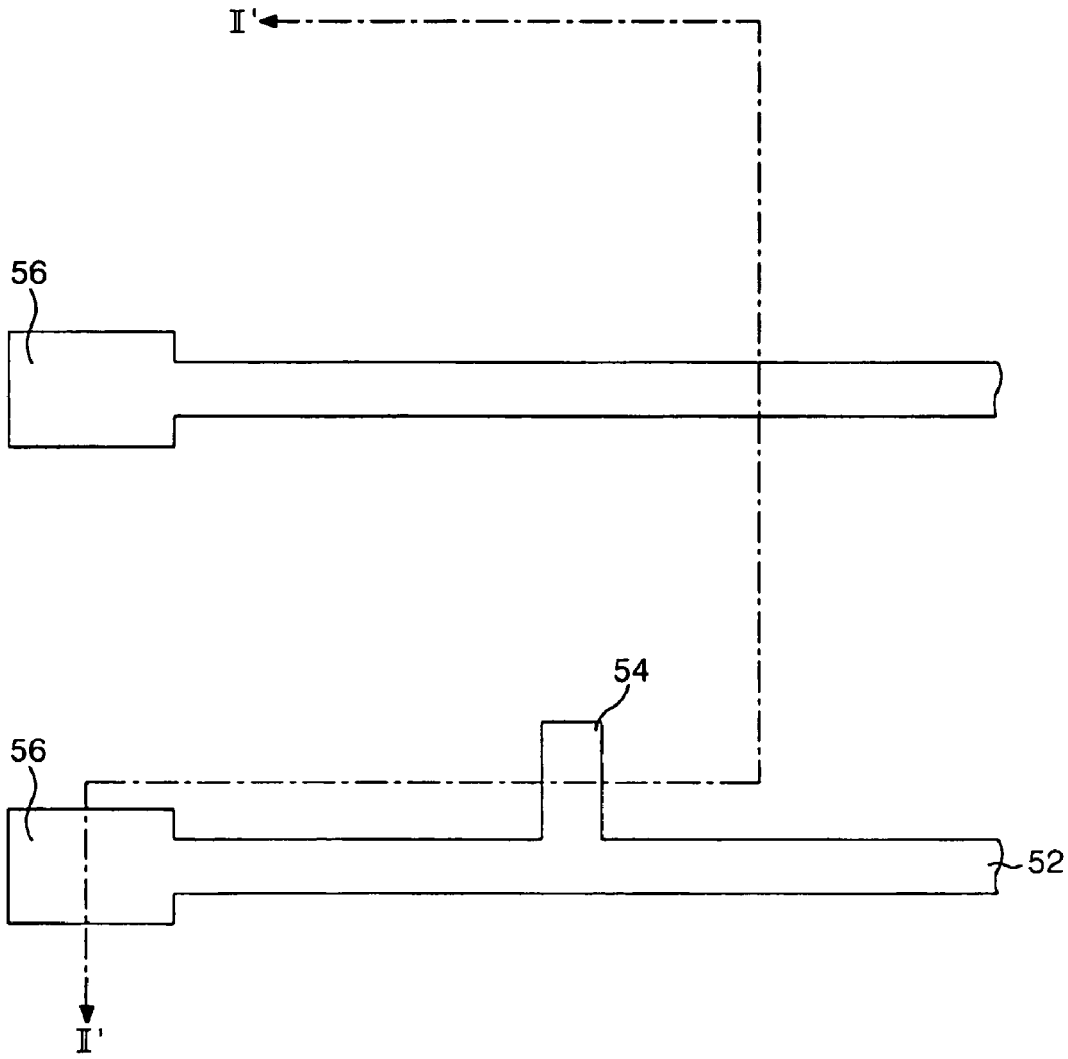
FIGS. 6A and 6B are plan and cross sectional views, respectively, of an exemplary first mask process of a method of fabricating a TFT array substrate according to the present invention.
Figure 6B:
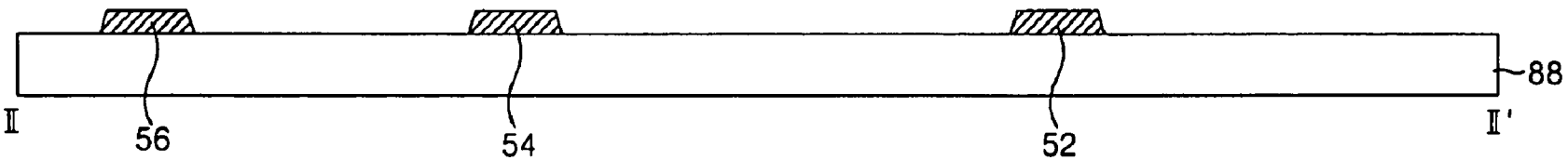

FIGS. 6A and 6B are plan and cross sectional views, respectively, of an exemplary first mask process of a method of fabricating a TFT array substrate according to the present invention. In FIGS. 6A and 6B, a gate metal layer may be formed by a deposition method, such as a sputtering, onto the lower substrate 88. Subsequently, the gate metal layer may be patterned through a photolithography process using the first mask and an etching process to form the gate patterns including the gate line 52 and the gate electrode 54. As the gate metal, Cr, MoW, Cr/Al, Cu, Al(Nd), Mo/Al, Mo/Al(Nd), Cr/Al(Nd) or the like may be used in a single layer structure or a double layer structure.

Figure 7A:
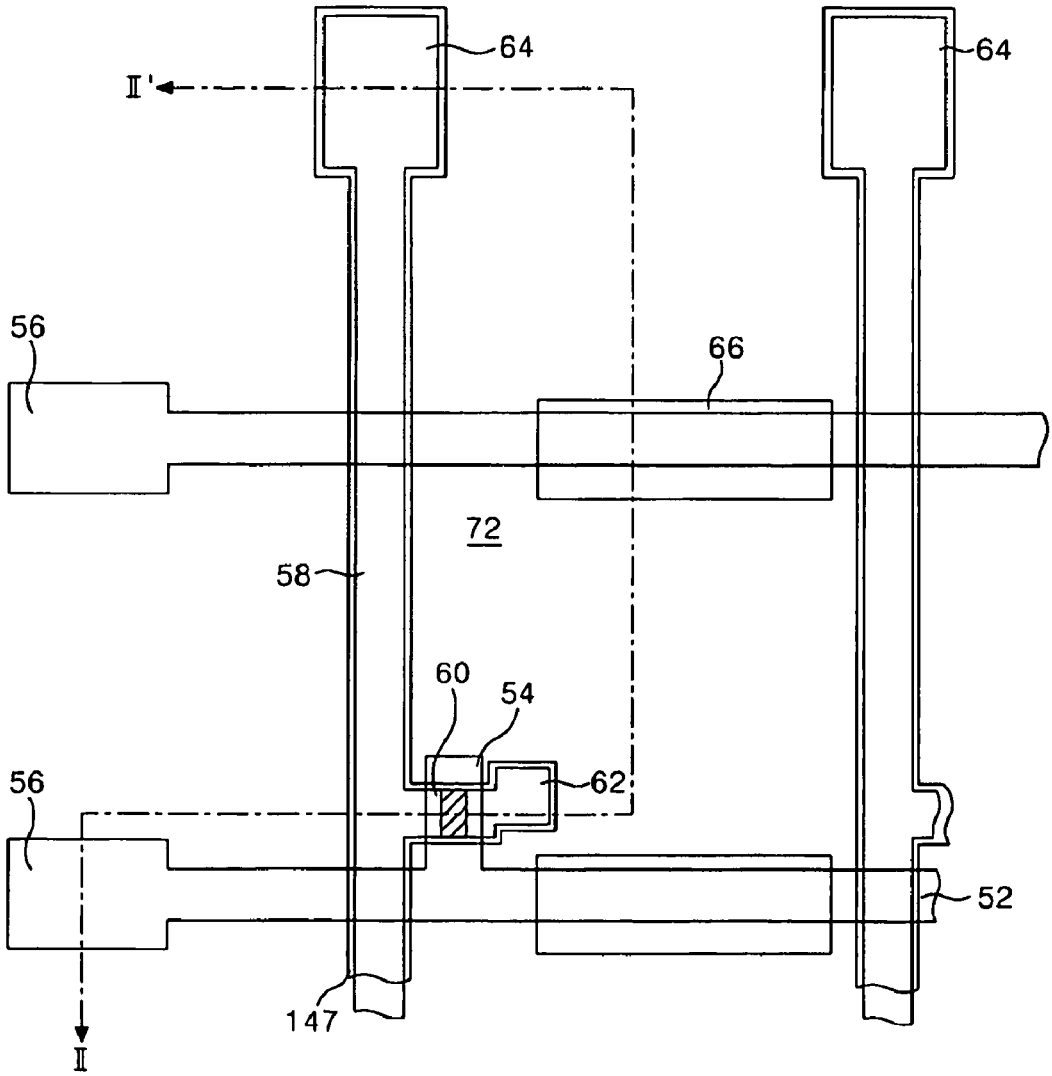
FIGS. 7A to 7C are a plan view and sectional views, respectively, of an exemplary second mask process of a method of fabricating a TFT array substrate according to the present invention.
Figure 7B:
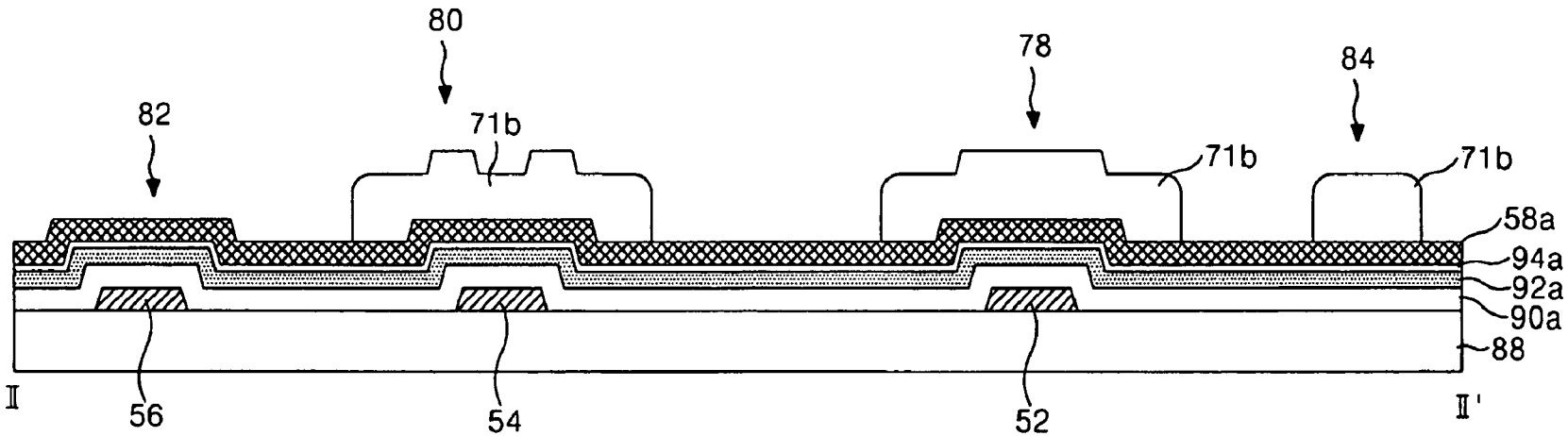
Figure 7C:
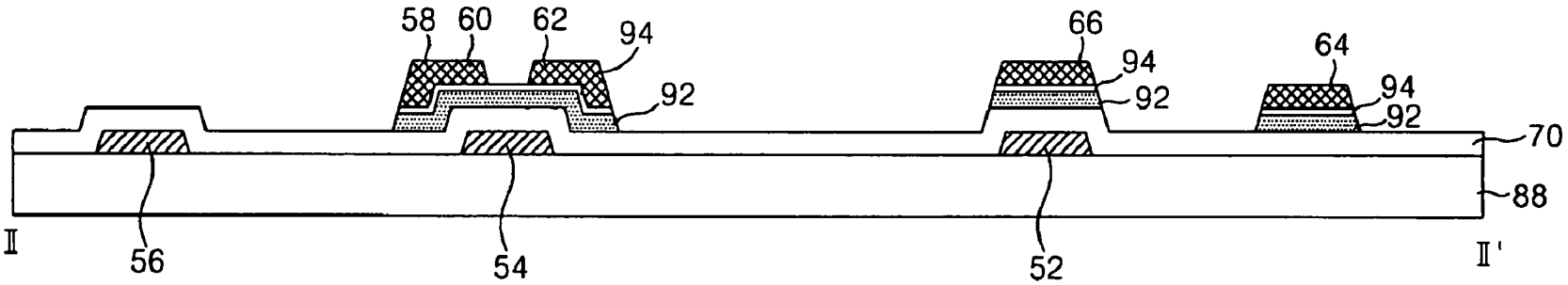

FIGS. 7A to 7C are a plan view and sectional views, respectively, of an exemplary second mask process of a method of fabricating a TFT array substrate according to the present invention. In FIG. 7B, a gate insulating layer 90a, an amorphous silicon layer 92a, an $n^+$ amorphous silicon layer 94a, and a source/drain metal layer 58a may be sequentially formed on the lower substrate 88 having the gate patterns by a deposition technique, such as plasma enhanced chemical vapor deposition (PECVD) and a sputtering method. Herein, the gate insulating layer 90a may be made of an inorganic insulating material, such as silicon oxide ($SiO_x$) or silicon nitride ($SiN_x$). The source/drain metal layer may be made of a molybdenum (Mo), a titanium (Ti), tantalum (Ta), and Mo alloy or the like.

Then, a photo-resist pattern 71b may be formed through a photolithography process using the second mask, as shown in FIG. 7B. In this case, a diffractive exposure mask having a diffractive exposing part may be used as a second mask wherein the diffractive exposing part may be corresponding to a channel portion of the thin film transistor. Accordingly, a photo-resist pattern 71b of the channel portion may have a lower height than a photo-resist pattern of the source/drain pattern part. Subsequently, the source/drain metal layer may be patterned by a wet etching process using the photo-resist pattern 71b to provide source/drain patterns including the data line 58, the source electrode 60, the drain electrode 62, which may be integral with the source electrode 60, and the storage electrode 66, as shown in FIG. 7C.

Next, the amorphous silicon layer and the $n^+$ amorphous silicon layer may be simultaneously patterned by a dry etching process using the same photo-resist pattern 71b to provide the ohmic contact layer 94 and the active layer 92. In addition, the photo-resist pattern 71b, which may have a relatively low height in the channel portion, may be removed by an ashing process, and thereafter the source/drain pattern and the ohmic contact layer 94 of the channel portion may be etched by a dry etching process. Accordingly, the active layer 92 of the channel portion may be exposed to separate the source electrode 60 from the drain electrode 62. Then, a remainder of the photo-resist pattern 71b left on the source/drain pattern part may be removed using a stripping process.

Figure 8A:
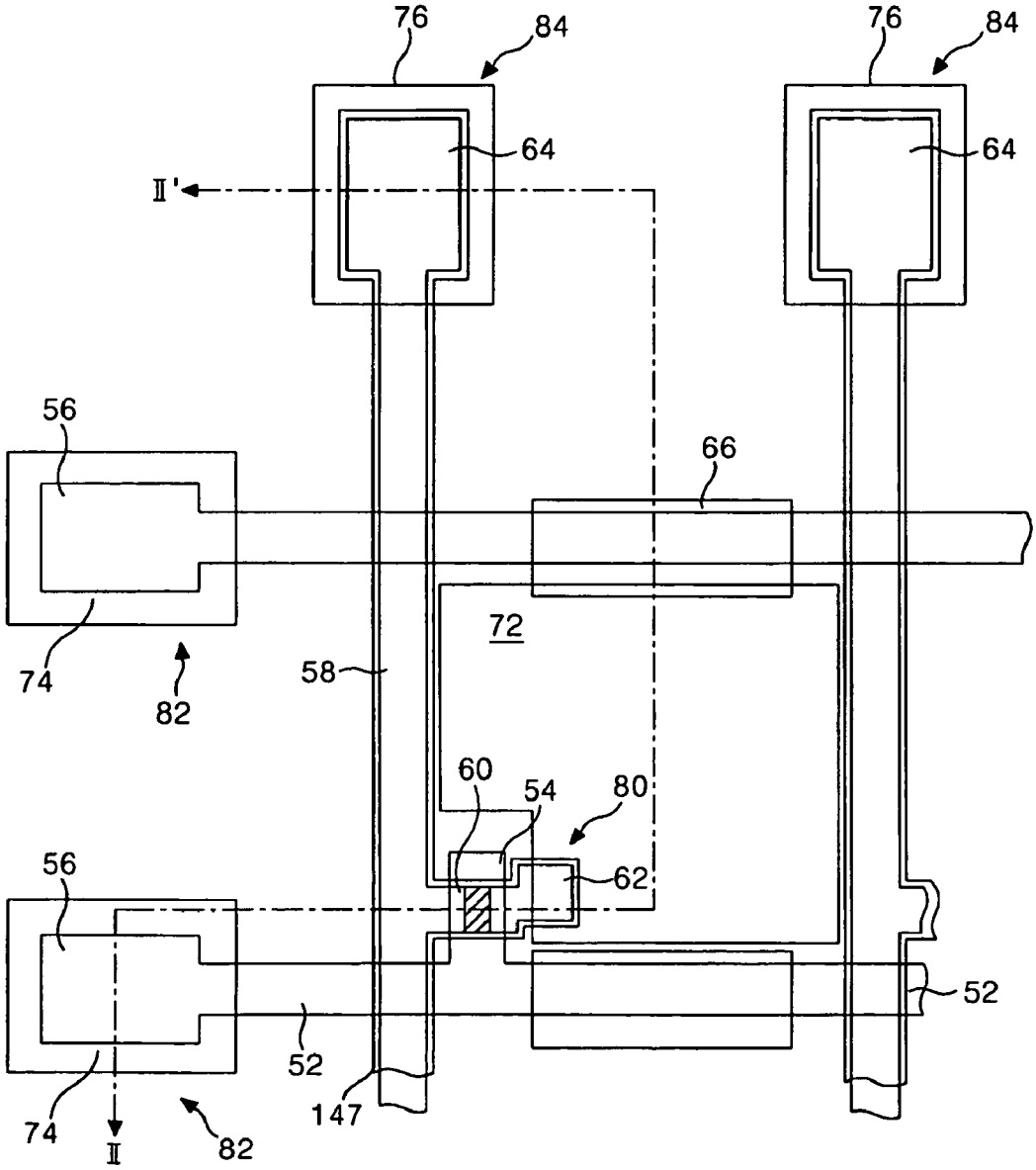
FIGS. 8A to 8D are a plan view and cross sectional views, respectively, of an exemplary third mask process of a method of fabricating a TFT array substrate according to the present invention.
Figure 8B:
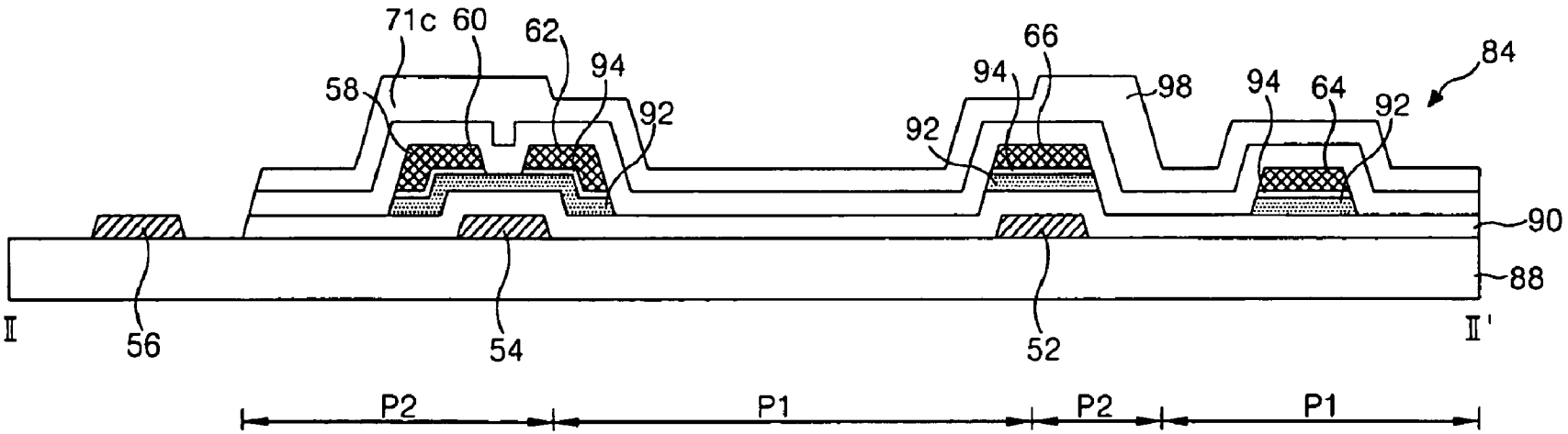

FIGS. 8A to 8D are a plan view and cross sectional views, respectively, of an exemplary third mask process of a method of fabricating a TFT array substrate according to the present invention. In FIGS. 8A to 8D, a passivation film 98, made of an inorganic insulating material, such as silicon oxide ($SiO_x$) and silicon nitride ($SiN_x$) or an organic insulating material having a small dielectric constant, such as an acrylic organic compound, an organic insulating material, such as benzocyclobutene (BCB) or perfluorocyclobutane (PFCB), may be entirely deposited by a deposition technique, such as a sputtering, on the gate insulating film 90 having the source/drain patterns formed thereon. In addition, a photo-resist may be entirely applied to the passivation film 98. Subsequently, a photo-resist pattern 71c may be formed by a photolithography process using the third mask, i.e. a diffractive exposure mask having a diffractive exposure part. Thus, the photo-resist pattern 71c may be formed at a region besides the region upon which the gate pad may be formed, as shown in FIG. 8B. In addition, the photo-resist patterns 71c at a partial region P1 of the drain electrode and the storage electrode, a pixel region P1, and a data pad region P1, which correspond to the diffractive exposure part, may be formed with a height lower than that of a region P2, i.e., a shielding region, which corresponds to the diffractive exposure part. Subsequently, the passivation film of the gate pad part 82 and the gate insulating film 90a of the passivation film may be removed by an etching process using the photo-resist pattern 71C as a mask. Then, the photo-resist pattern 71c having a relatively lower height may be removed by an ashing process. Next, the passivation film may be patterned by an etching process using a remainder of photoresist pattern 71c as a mask to expose a portion of the storage electrode 66, a portion of the drain electrode 62, and the lower data pad electrode 64.

Figure 8C:
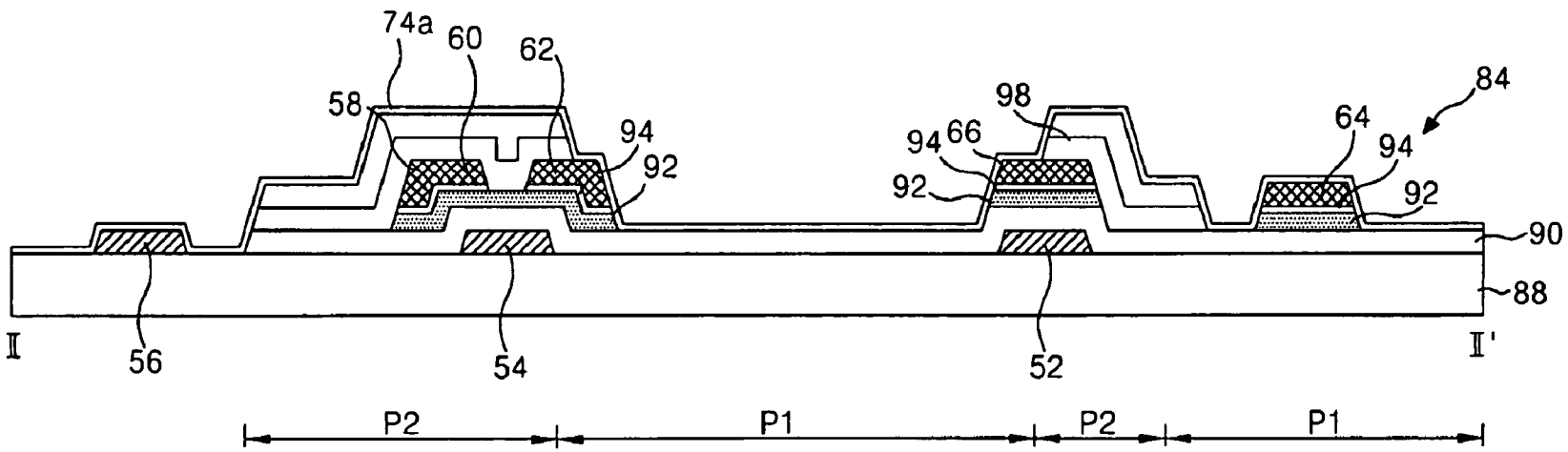
Figure 8D:
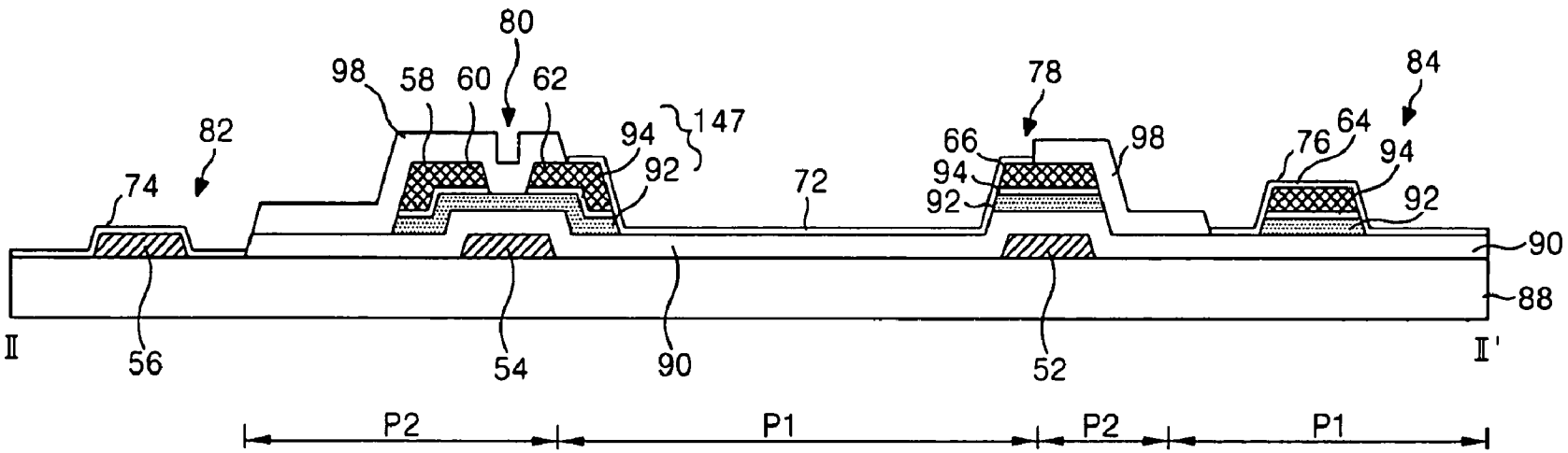

In FIG. 8C, a transparent electrode material 74a may be entirely deposited on the TFT array substrate 88 having the remainder of photo-resist pattern 71c (in FIG. 8B) thereon by a deposition technique, such as a sputtering. Accordingly, the transparent electrode material may be made of indium-tin-oxide (ITO), tin-oxide (TO), or indium-zinc-oxide (IZO). Next, the photo-resist pattern 71c may be removed from the TFT array substrate 88 having the transparent electrode material deposited thereon by a stripping process, such as a lift-off method. Then, the transparent electrode material 74a deposited on the photo-resist pattern 71c may be removed together with the photo-resist pattern 71c being taken off to form a transparent pattern including the upper gate pad electrode 74, the pixel electrode 72, and the upper data pad electrode 76, as shown in FIG. 8D.

The upper gate pad electrode 74 may be formed to cover the lower gate pad electrode 56. In addition, the pixel electrode 72 may be connected to the drain electrode 62 of the TFT 80 and the storage electrode 66 of the storage capacitor 78, and the upper data pad electrode 76 may be electrically connected to the lower data pad electrode 64.

According to the present invention, a TFT array substrate and a method of fabricating a TFT array substrate may adopt a first mask process for forming gate patterns, a second mask process for forming a semiconductor pattern and source/drain patterns, and a third mask process for forming a transparent electrode pattern by patterning the transparent electrode through a stripping process for a photo-resist pattern used in a patterning process for a gate insulating film and a passivation film. Accordingly, simplification of the TFT array substrate and fabrication process thereof may be achieved, thereby reducing fabrication costs and increasing fabrication yield.

According to the present invention, a diffractive exposure mask may be used to fabricate a TFT array substrate by adopting the three-round mask process, wherein a gate insulating pattern having highest height among the TFT array may be formed between the pixel electrode and a lower substrate. Accordingly, a step height between the pixel regions having the pixel electrode formed thereon, a TFT, and a storage capacitor may not be large. Thus, it is possible to maintain the same uniformity of a rubbing process and the same contrast using a four-round mask process and a fifth-round mask process.

Figure 9:
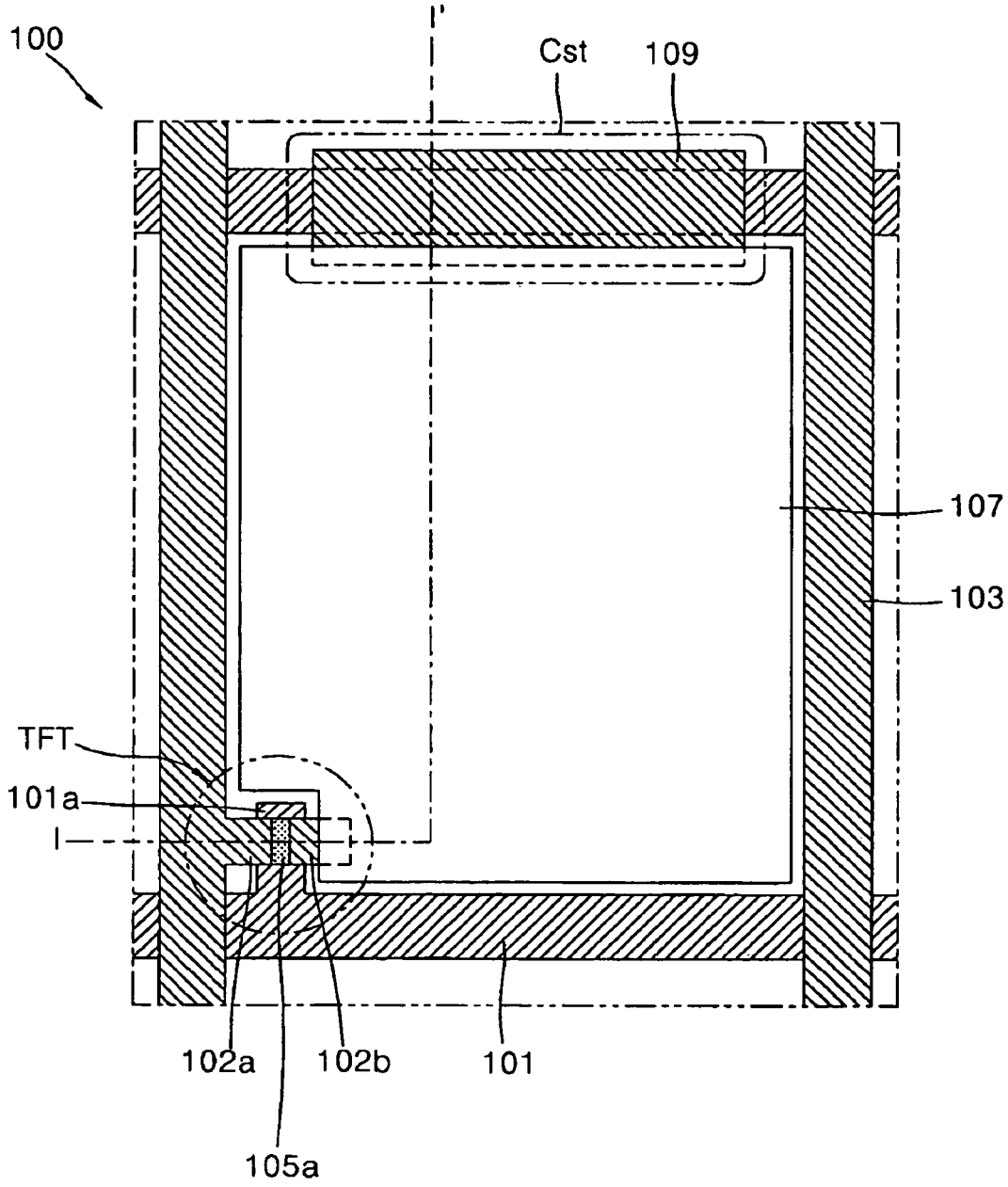
FIG. 9 is a plan view of an exemplary LCD device according to the present invention.

FIG. 9 is a plan view of an exemplary LCD device according to the present invention. In FIG. 9, each pixel on a TFT array substrate with an N×M matrix configuration of pixels may include a TFT defined at each crossing of a gate line 101, which may receive a scan signal from an external driving circuit, and a data line 103, which may receive an image signal. The TFT may include a gate electrode 101a connected to the gate line 101, an active layer 105 a overlapping the gate electrode 101a to be insulated from the gate electrode 101a, and source/drain electrodes 102a and 102b formed on the active layer 105a. In addition, a pixel electrode 107 may be formed at a display region of the pixel, wherein the drain electrode 102b may be connected to the pixel electrode 107 to which the image signal may be supplied via the data line 103 and the source/drain electrodes 102a and 102b. Furthermore, the pixel electrode 107 may be connected to a storage electrode 109 overlapping the gate line 101. Moreover, the storage electrode 109 may form the storage capacitor Cst along with the gate line 101, and the storage capacitor Cst may be formed by overlapping the pixel electrode 107 and the gate line 101 without forming the storage electrode 109. Although not shown, a repair pattern may be formed at a lower portion of the data line 103 and the repair pattern may be made in a process for forming the gate line.

Accordingly, an LCD panel may include the TFT array substrate, as described above, wherein the drain electrode 102b of the TFT may be electrically connected to the pixel electrode 107 formed in the pixel so that a liquid crystal material may be driven by applying a signal via the source/drain electrodes 102a and 102b to the pixel electrode 107 to display images. Although not shown, a gate pad and a data pad may be formed at extended one sides from the gate line 101 and the data line 103 to receive signals from the external driving circuit, respectively. According to the present invention, a TFT array substrate constituted as described above may be fabricated using a three-round mask process.

Figure 10A:
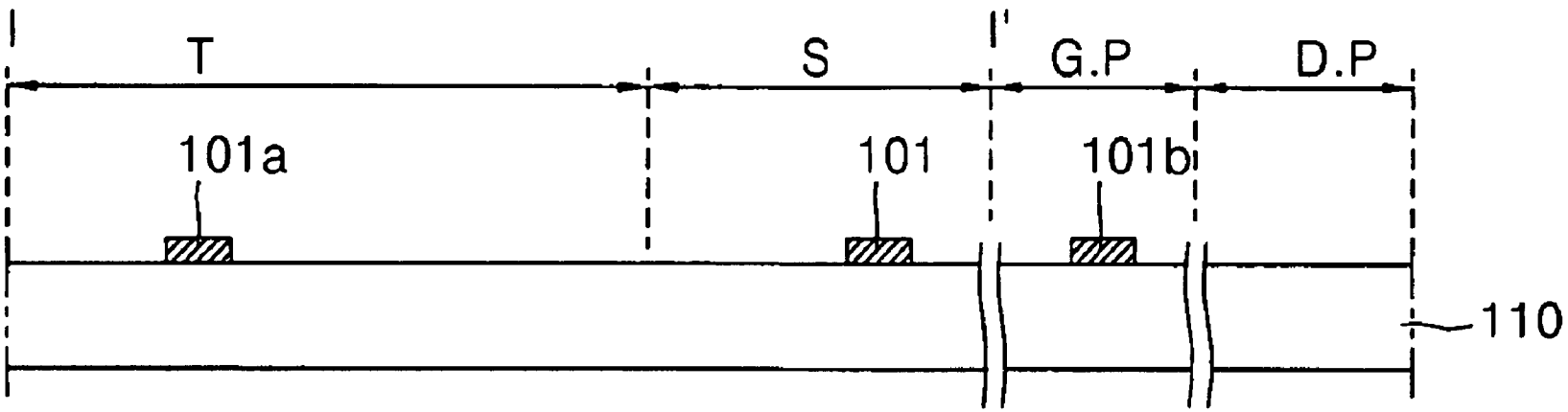
FIGS. 10A to 10C are cross sectional views of an exemplary first mask process of a method of fabricating an LCD device according to the present invention.
Figure 10B:
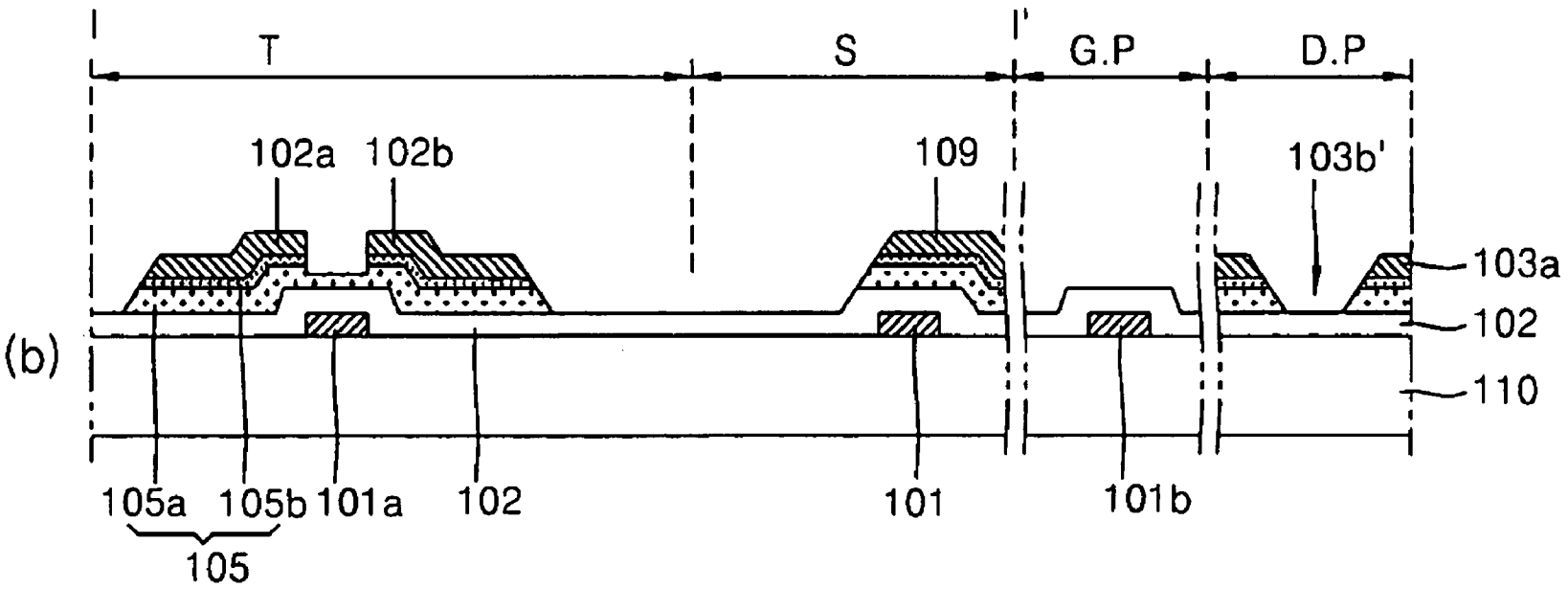
Figure 10C:
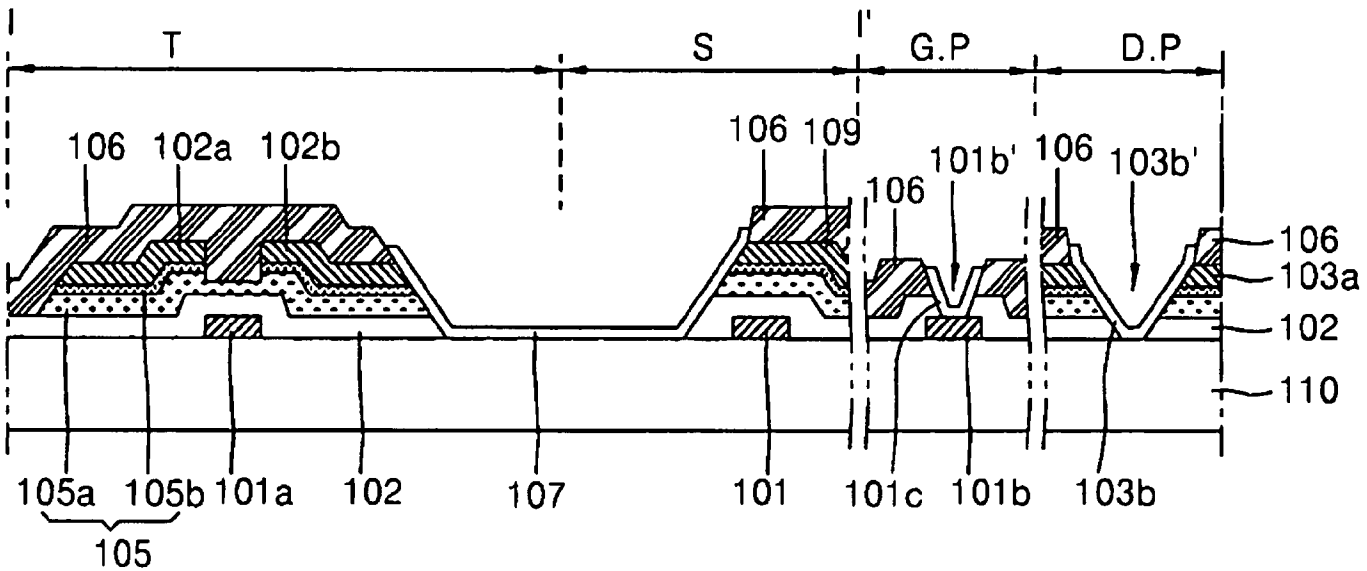

FIGS. 10A to 10C are cross sectional views of an exemplary first mask process of a method of fabricating an LCD device according to the present invention. In FIGS. 10A to 10C, a TFT region T, a storage capacitor region S, a gate pad region G.P may be formed at one side of a gate line, and a data pad region D.P formed at one side of a data line.

In FIG. 10A, after preparing a transparent substrate 110, aluminum (Al), medium (Mo), copper (Cu), MoW, MoTa, MoNb, chrome (Cr), tungsten (W), or a first metal film (not shown) of a double layer of aluminum (Al) and molybdenum (Mo) may be deposited on the substrate 110 by a sputtering method. Then, the first metal film may be patterned through a first mask process to form the gate electrode 101a, the gate line 101, and the gate pad 101b.

FIG. 10B, an inorganic material, such as silicon nitride SiNx or silicon oxide SiOx, may be deposited along an entire surface of the substrate 110 provided with the gate electrode 101a, the gate line 101, and the gate pad 101b to form a first insulating film 102, i.e., a gate insulating film. Then, an amorphous silicon layer, an n' amorphous silicon layer doped with an impurity, such as phosphorus (P), and a second metal film, such as Al, AlNd, Cr, Mo and Cu, may be sequentially deposited on an upper portion of the first insulating film 102. Next, a semiconductor layer 105 including the active layer 105a and an ohmic contact layer 105b, source/drain electrodes 102a and 102b separated by a designated gap from each other on an upper portion of the semiconductor layer 105 to expose a middle of the active layer 105a, the storage electrode 109 located at an upper portion of the gate line 101, and the data pad 103a may be respectively formed through a second mask process.

Accordingly, the second mask process may employ a diffractive exposure mask or a half-tone mask, each of which may be a partial exposure mask, since the semiconductor layer 105 and the source/drain electrodes 102a and 102b are to be simultaneously formed through a single mask process. Such a diffractive exposure mask has a diffractive exposure region with a slit structure wherein an amount of exposure light irradiated through the diffractive exposure region is less than an amount of an exposure light transmitted through a transmission region entirely transmitting the light. Thus, after applying a photo-resist (PR) film, if the PR film is partially exposed through the use of a mask provided with a diffractive exposure region and a transmission region, then a remainder of the PR film corresponding to the diffractive exposure region and a remainder of the PR film corresponding to the transmission region may have different heights from each other. In other words, for a positive PR film, the PR film where light is irradiated through the diffractive exposure region has a thickness thicker than that of the transmission region. On the other hand, for a negative PR film, the PR film remained at the transmission region is thickly formed.

According to the present invention, the semiconductor layer 105 and the source/drain electrodes 102a and 102b may be simultaneously formed using a characteristic of the diffractive exposure mask. In addition or alternatively, a half-tone mask may also be used. In a case of the half-tone mask, chrome (cr) may be formed at a shielding region and molybdenum silicide (MoSi) may be formed at a half-tone region. Thus, the amount of light transmission may be controlled by adjusting a thickness of the molybdenum silicide (MoSi).

Figure 11A:
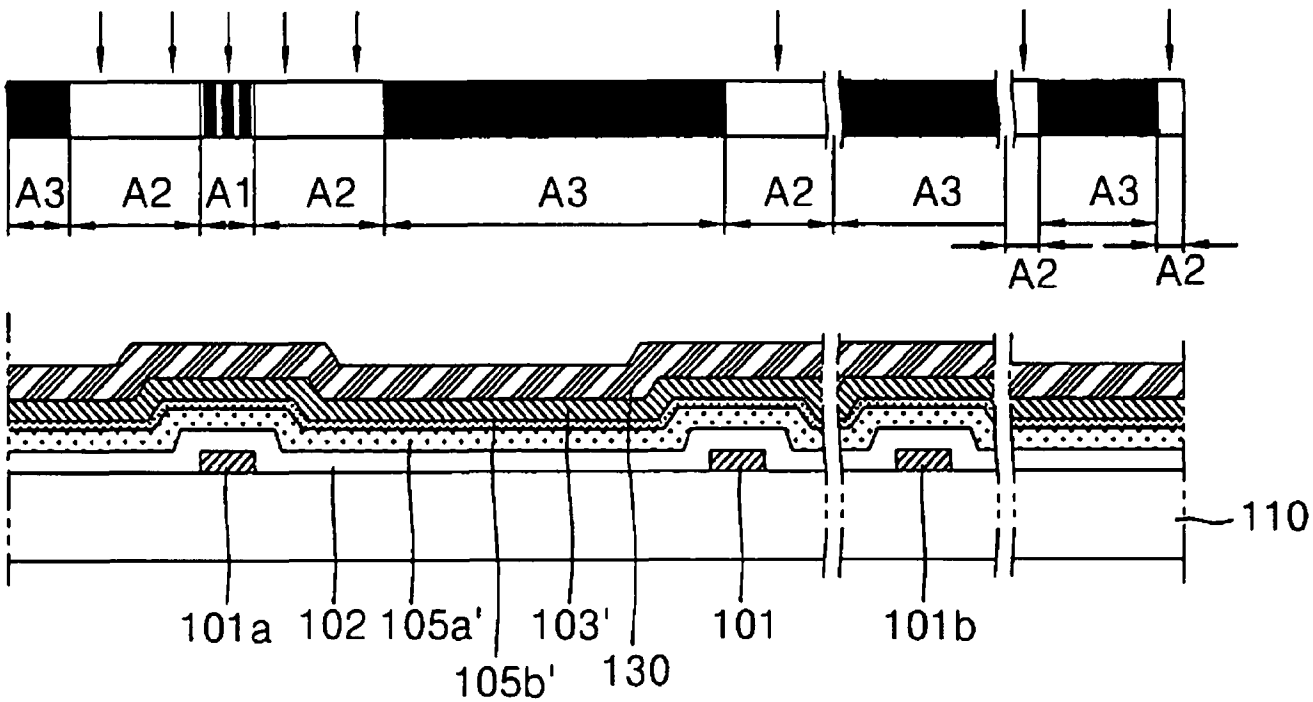
FIGS. 11A to 11C are cross sectional views of an exemplary second mask process of a method of fabricating an LCD device according to the present invention.
Figure 11B:
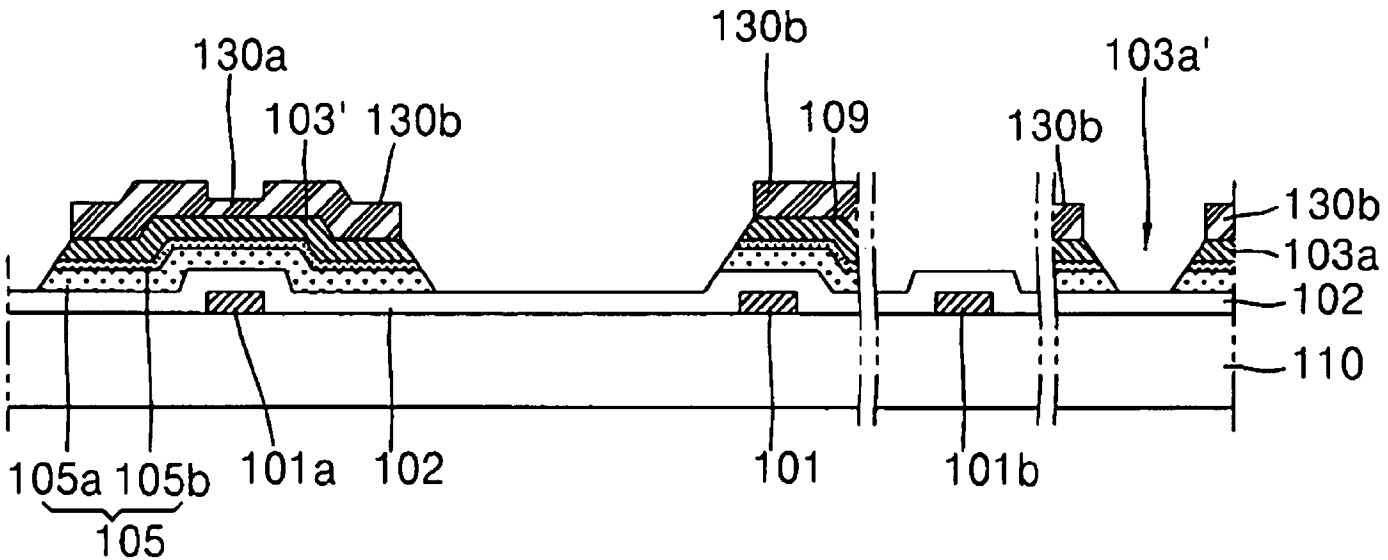
Figure 11C:
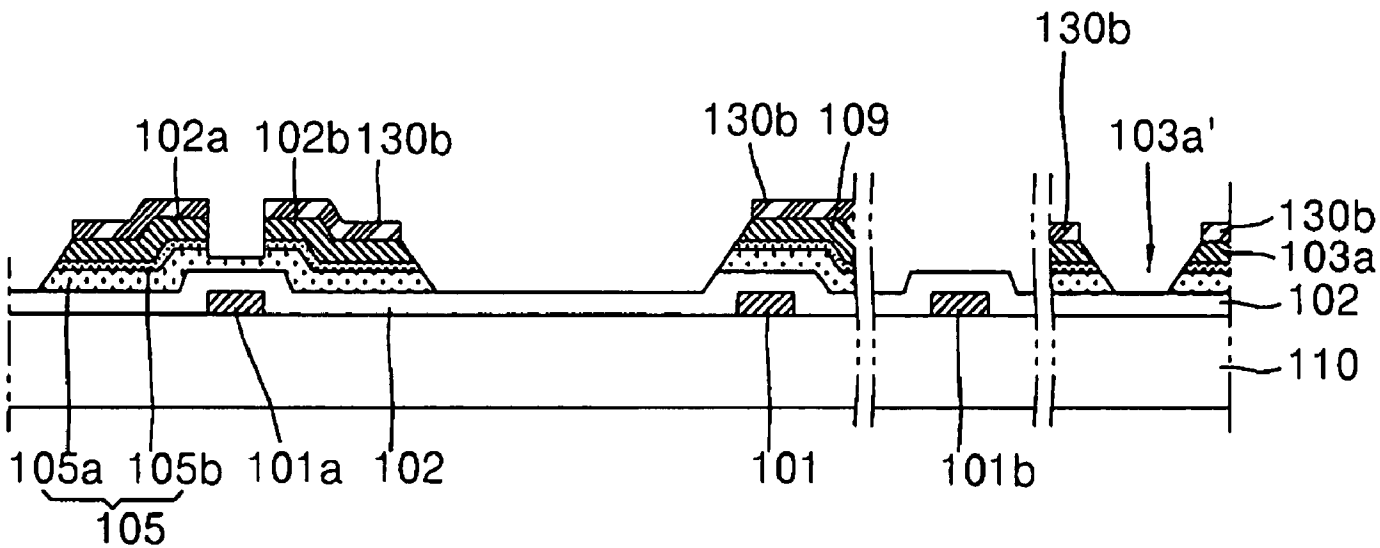

FIGS. 11A to 11C are cross sectional views of an exemplary second mask process of a method of fabricating an LCD device according to the present invention. In FIG. 11A, a first insulating film 102, an amorphous silicon layer 105a', an $n^+$ amorphous silicon layer 105b', and a second metal film 103' may be sequentially stacked along an entire surface of the substrate 110 provided with the gate electrode 101a, the gate line 101, and the gate pad 11b. Then, a PR film 130 may be applied to an upper portion of the second metal film 103', and light, such as ultra violet, may be irradiated through a diffractive exposure mask 140. At this time, the diffractive exposure mask may include a diffractive exposure region A1 partially transmitting the irradiated light, a transmission region A2 entirely transmitting the irradiated light, and a shielding region A3 entirely shielding the irradiated light. Accordingly, the light transmitted through the diffractive exposure mask 140 may be irradiated onto the PR film 130.

In FIG. 11B, the PR film 130 exposed by the light may be developed through the diffractive exposing mask 140. Accordingly, the PR film remains at only a region to which the light is irradiated through the diffractive exposure region A1 and the transmission region A2, and the remaining PR films at the other regions may be removed. Thus, a first PR pattern 130a formed through the diffractive exposure region A1 may be thinner than a second PR pattern 130b formed through the transmission region A2 due to use of the negative PR film. Since the negative PR film has a resolution higher than that of the positive PR film, the negative PR film may be used. Alternatively, the positive PR film may be used, wherein the pattern of the diffractive exposure mask may be oppositely made. In other words, the light should be shielded at a region desired to retain the PR film.

Next, the second metal film 103', the $n^+$ amorphous silicon layer 105b, and an amorphous silicon layer 105a formed at a lower portion of the first and the second PR patterns 130a and 130b may be etched by using the first and the second PR patterns 130a and 130b as masks to form an active layer 105a, an ohmic contact layer 105b, a storage electrode 109, and a data pad 103a. Accordingly, a lateral surface portion of the data pad 103a may be exposed by a contact hole 103a'.

In FIG. 11C, the first PR pattern 130a may be removed through an ashing process. At this time, a portion of the second PR pattern 130b may be removed together with the first PR pattern to reduce a thickness of the second PR pattern. Then, the second metal film 103' and the ohmic contact layer 105b may be exposed by removing the first PR pattern 130a through the use of the second PR pattern 130b as a mask. Next, they may be then etched to form the source/drain electrodes 102a and 102b. Accordingly, the source/drain electrodes 102a and 102b may be separated from each other by a designate gap on an upper portion of the active layer 105a. Then, the ohmic contact layer 105b may be formed in order for reducing a contact resistance between the active layer 105a and the source/drain electrodes 102a and 102b to smoothly transmit operational signals. Next, the second PR pattern 130b formed on the source/drain electrodes 102a and 102b and the storage electrode 109 may be removed by using a stripper.

Figure 12A:
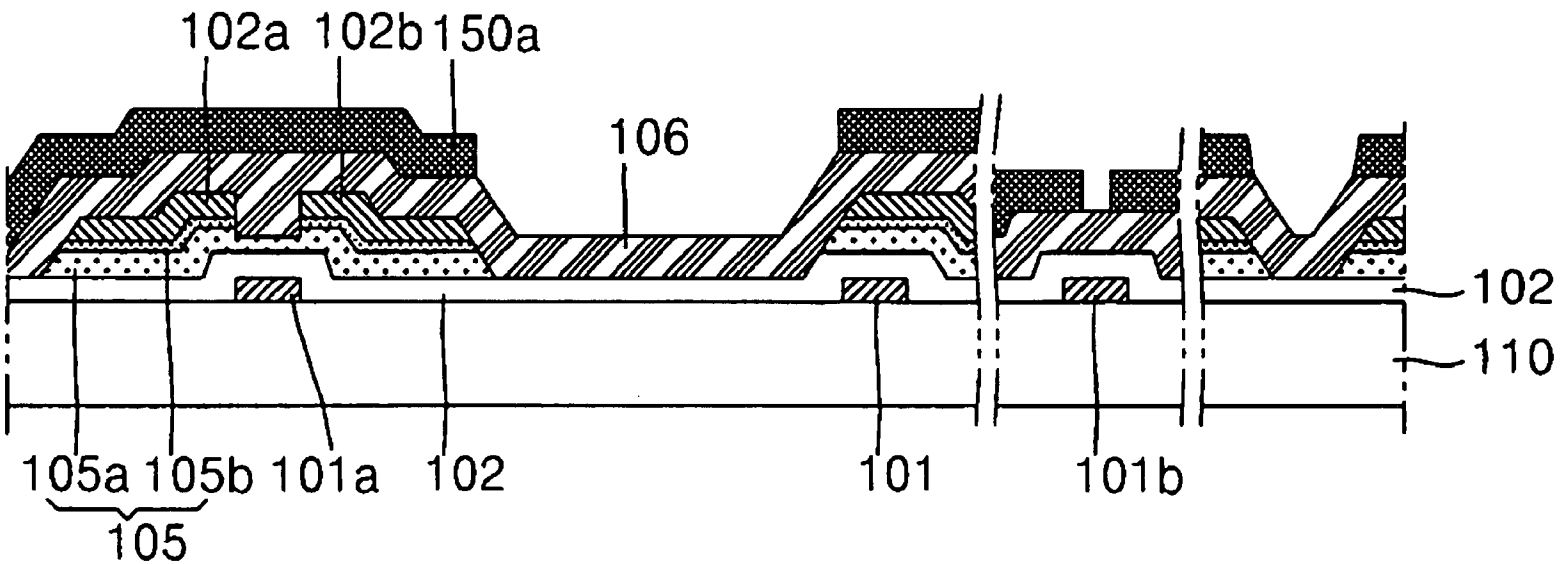
FIGS. 12A to 12D are cross sectional views of an exemplary third mask process of a method of fabricating an LCD device according to the present invention.

FIGS. 12A to 12D are cross sectional views of an exemplary third mask process of a method of fabricating an LCD device according to the present invention. As described above, the semiconductor layer 105, the source/drain electrodes 102a and 102b, the storage electrode 109, and the data pad 103a may be formed through the second mask process, and then a second insulating film 106 (i.e., a passivation film) may be formed on their upper portion, as shown in FIG. 12A. After applying a PR film on the second insulating film 106, the PR film may be patterned through a third mask process, so that portions of the drain electrode 102b and the storage electrode 109 (in FIG. 12B) may be exposed to form first and second contact holes 101b' and 103a', respectively, exposing the gate pad 101b and the data pad 103a. Then, a transparent conductive film may be deposited on the substrate 110 after the third mask process.

Next, a pixel electrode 107, which may be connected to the drain electrode 102b and the storage electrode 109, and a gate connection terminal 101c and a data connection terminal 103b, respectively, may be connected via the first and the second contact holes 101b' and 103a' to the gate pad 101b and the data pad 103a, which may be formed through a lift-off process.

According to the present invention, by using the lift-off process in the third mask process, the passivation film and the pixel electrode may be formed through a single mask process.

In FIG. 12A, an inorganic film, such as silicon oxide SiOx and silicon nitride SiNx, or an organic film such as BCB and acryl, may be applied along an entire surface of the substrate 110 provided with the source/drain electrodes 102a and 102b, and the storage electrode 109 (in FIG. 12B) to form a second insulating film 106. Then, a PR film may be applied to an upper portion of the second insulating film, and patterned through the third mask process to selectively form a PR pattern 105a on the second insulating film 106.

Figure 12B:
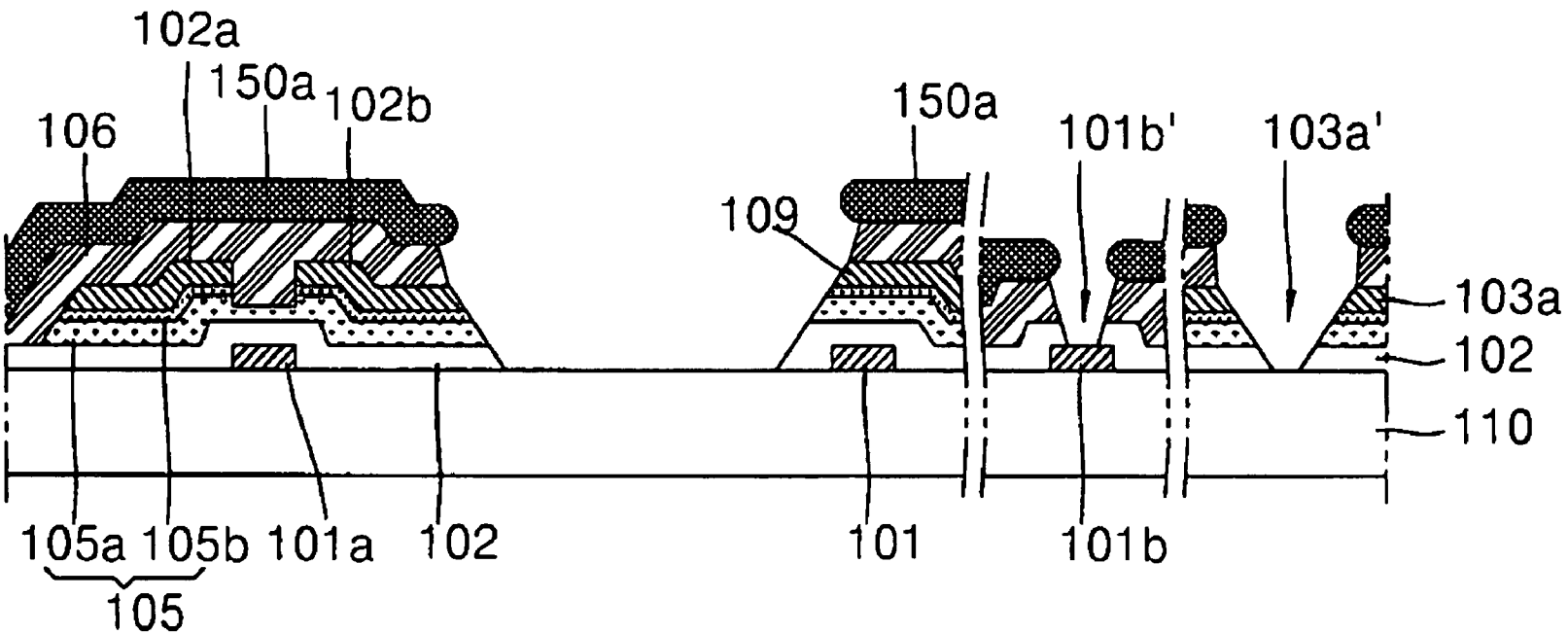

In FIG. 12B, the first and the second insulating films 102 and 106 may be removed by using the PR pattern 150a as a mask to expose one side of the drain electrode 102b and one side of the storage electrode 109 and, at the same time, to reveal the substrate 110 of a pixel region. Accordingly, the first contact hole 101b' exposing a portion of a gate pad 101b and the second contact hole 103a' exposing a portion of a data pad 103a may be formed together. Then, the first and the second insulating films 102 and 106 may be effectively removed by a dry etching. If the etching process continually progresses after forming all of the desired patterns, then the second insulating film 106 may be over etched to protrude an edge region of the PR pattern 150a.

Figure 12C:
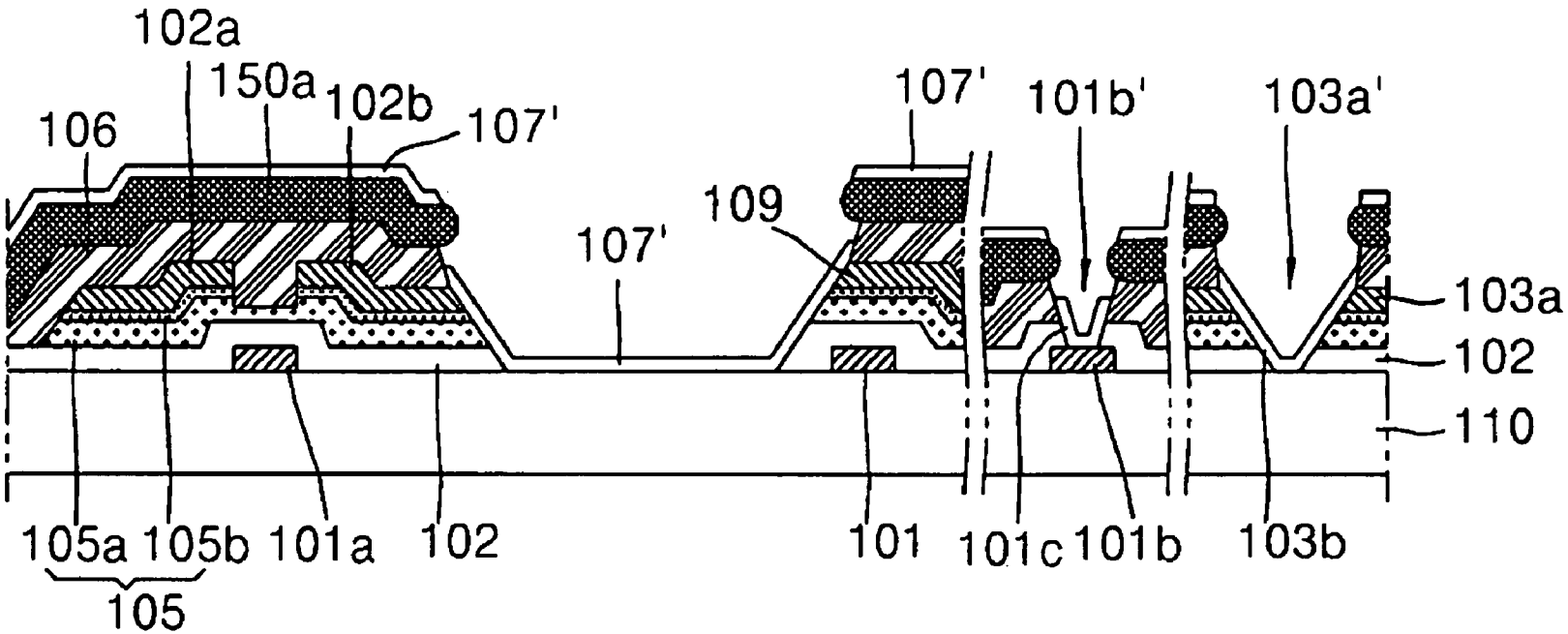

In FIG. 12C, a transparent conductive film 107, such as indium-tin-oxide (ITO) or indium-zinc-oxide (IZO), may be deposited along an entire surface of the substrate 110 including the PR pattern 150a having the protruded edge region. At this time, since the conductive film 107' may not be deposited on a lower portion of the edge region in the PR pattern 150a, this region may be exposed to an exterior.

Figure 12D:
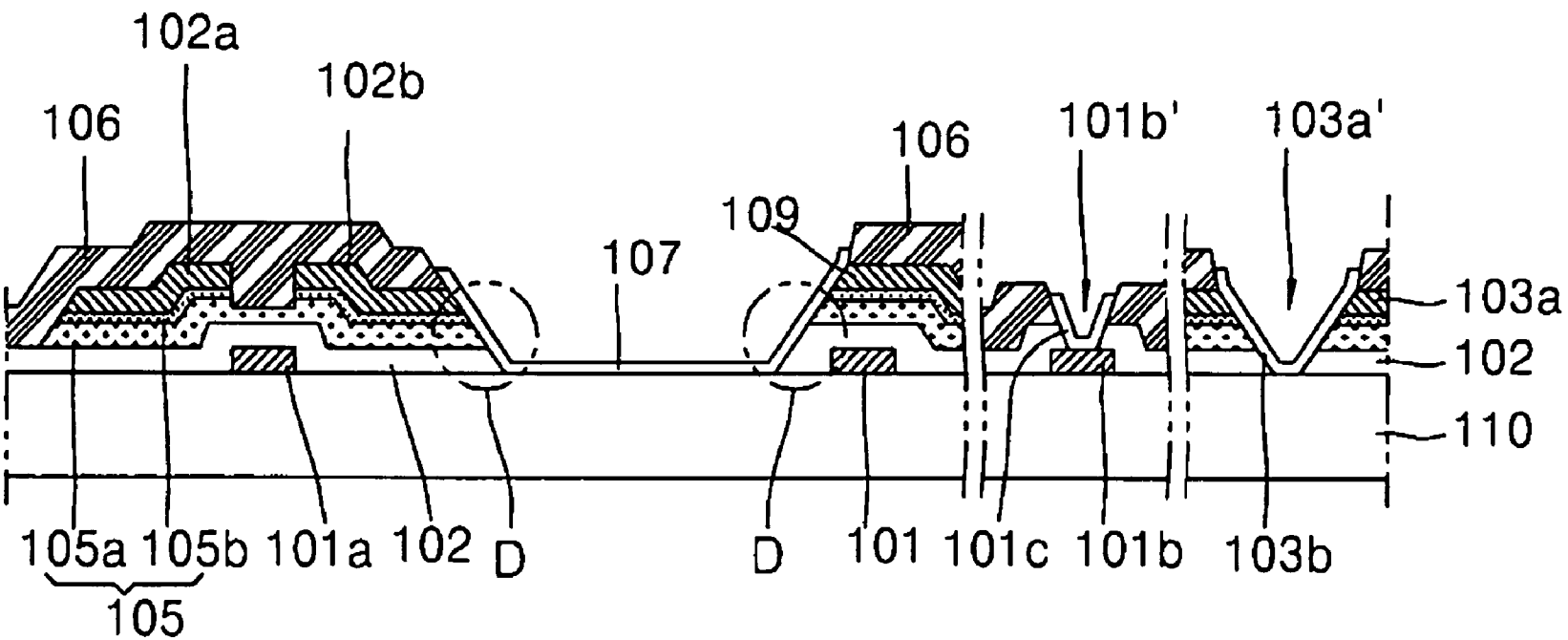

In FIG. 12D, the PR pattern 150a having the partially exposed edge region may be removed by a stripper and, at the same time, the conductive film 107' deposited on the PR pattern 150a may also be removed together therewith to form the pixel electrode 107, the gate connection terminal 101c, and the data connection terminal. Accordingly, the pixel electrode 107 may be connected to the drain electrode 102b and the storage electrode 109, the gate connection terminal 101c may be connected via the first contact hole 101b' to the gate pad 101b, and the data connection terminal 103b may be connected via the second contact hole 103a' to the data pad 103a.

According to the present invention, in the third mask process, after forming the PR pattern on the passivation film, the passivation film may be over etched to form a protruded region of the PR pattern. Then, a transparent conductive film may be deposited on an upper portion of the protruded region of the PR pattern to expose a portion of the PR pattern to an exterior. Furthermore, the passivation film and the pixel electrode may be formed by a single mask process through a lift-off process removing the PR pattern along with the transparent conductive film deposited on the upper portion of the PR pattern by a stripper.

In FIG. 12D, since step heights of the pixel electrode connected to the drain electrode 102b and the pixel electrode connected to the storage electrode 109 are generated by the gate insulating film 102, the active layer 105a, the ohmic contact layer 105b, and the drain electrode 102b, then liquid crystal material may not be normally driven at a region of the step heights D and a defect, such as a light leakage, may occur on a display screen. Accordingly, in order to shield the region defined by the light leakage, a black matrix may be formed to extend to the light leakage region. Accordingly, however, an aperture ratio may be reduced. As a result, there occurs a problem that screen brightness may be reduced.

Therefore, according to the present invention, a diffractive exposure mask or a half-tone mask may be used during the third mask process to reduce the step heights of the pixel electrode produced at the regions connected to the drain electrode and the storage electrode, thereby minimizing the light leakage region and improving aperture ratio. In other words, a diffractive exposure may be applied to the pixel region to leave the gate insulating film without removing. As a result, the stepper heights due to the gate insulating film can be removed.

FIGS. 13A to 13E are cross sectional views of another exemplary third mask process of a method of fabricating an LCD device according to the present invention. Since FIGS. 13A to 13E are similar to FIGS. 12A to 12D, description for configurations of shown in FIGS. 13A to 13E have been omitted for the sake of simplicity.

Figure 13A:
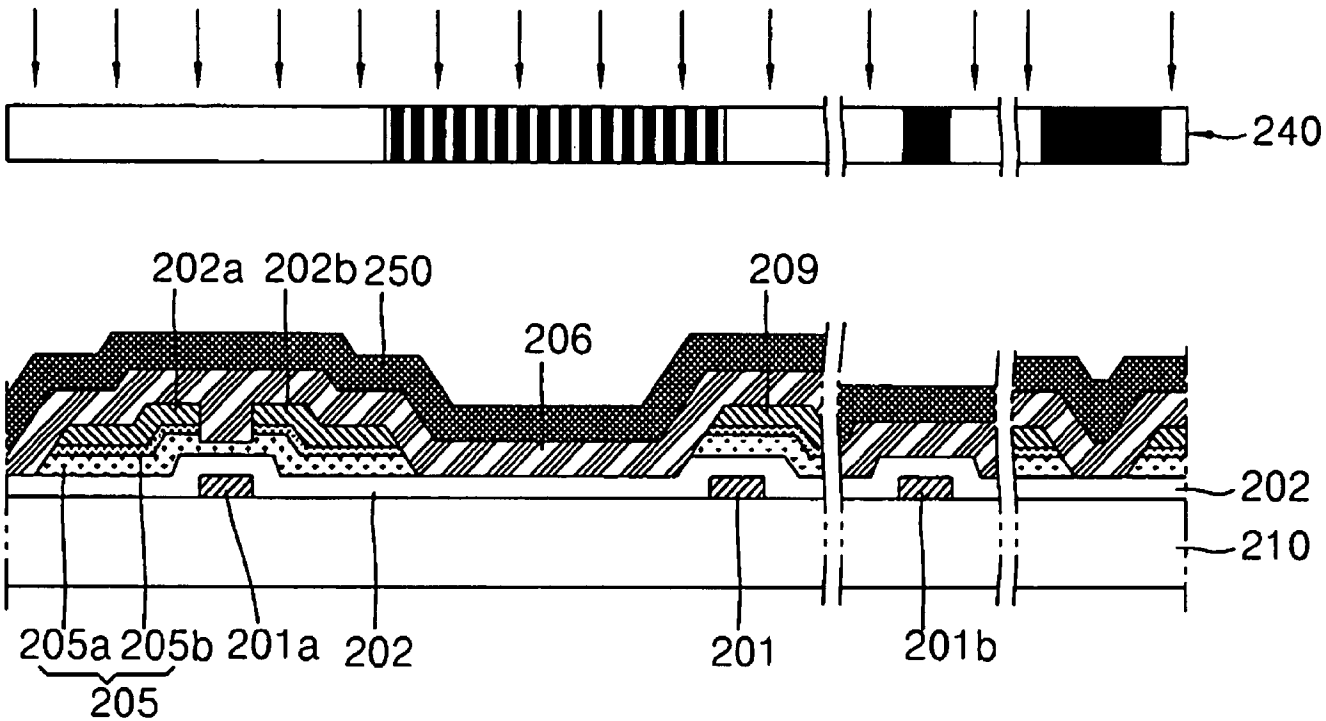
FIGS. 13A to 13E are cross sectional views of another exemplary third mask process of a method of fabricating an LCD device according to the present invention.

In FIG. 13A, an inorganic film, such as silicon oxide SiOx and silicon nitride SiNx, or an organic film, such as BCB or acryl, may be applied along an entire surface of a substrate 210 provided with source/drain electrodes 202a and 202b, and a storage electrode 209 to form a second insulating film 206. Then, a PR film 250 may be applied to an upper portion of the second insulating film, and light, such as ultra violet light, may be irradiated through a diffractive exposure mask or a half-tone mask 240. The diffractive exposure mask 240 may include a diffractive exposure region partially transmitting the light, a transmission region entirely transmitting the light, and a shielding region entirely shielding the light. Accordingly, the light transmitting the diffractive exposure mask 240 may be irradiated to a PR film 250.

Figure 13B:
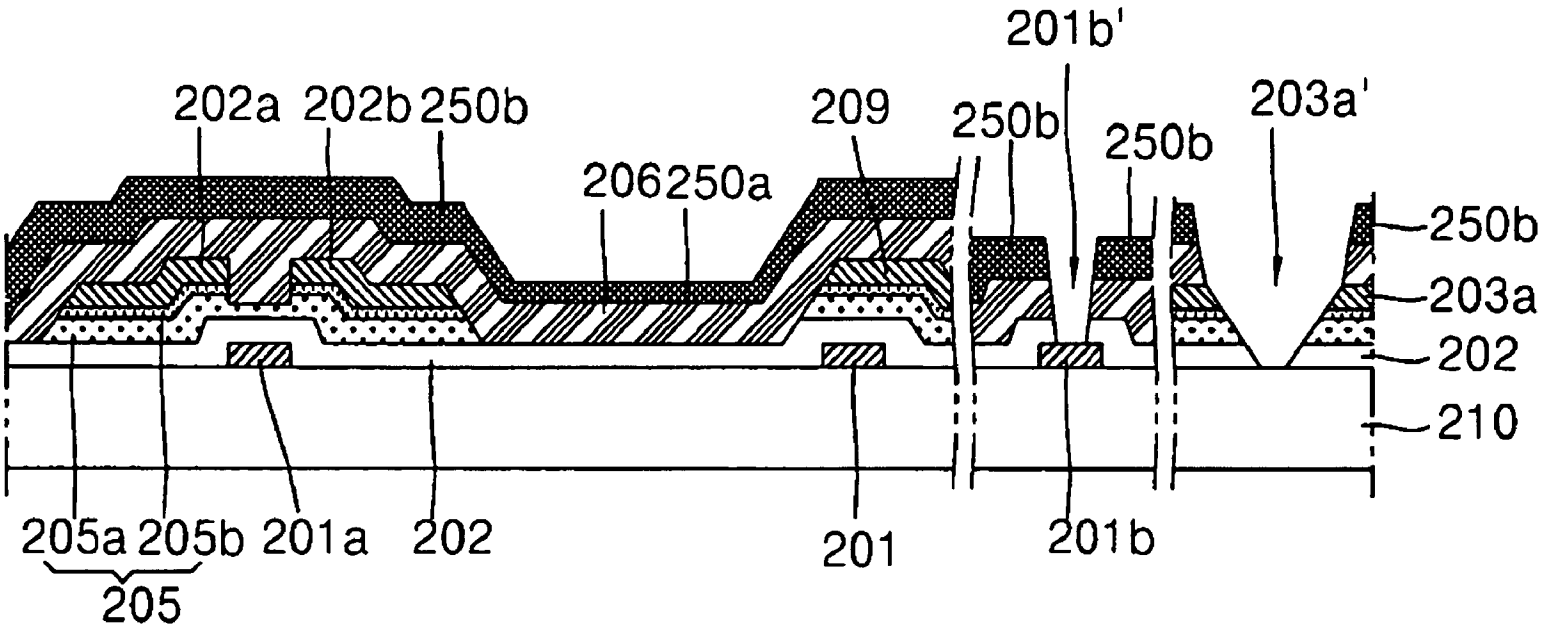

In FIG. 13B, the PR film 250 exposed by the light may be developed through the diffractive exposing mask 240. Then, the PR film may be retained at only a region to which the light is irradiated through the diffractive exposure region A1 and the transmission region A2, and the remaining PR films at the other region may be removed. Accordingly, a thickness of a first PR pattern 250a formed through the diffractive exposure region A1 may be reduced to be less than a thickness of a second PR pattern 250b formed through the transmission region A2. Next, the first and the second insulating films 202 and 206 may be etched by using the first and the second PR pattern 250a and 250b as masks to form a first contact hole 201b' exposing a gate pad 201b and a second contact hole 203a' exposing a data pad 203b. Then, the first and the second insulating films 202 and 206 may be efficiently removed by dry etching.

Figure 13C:
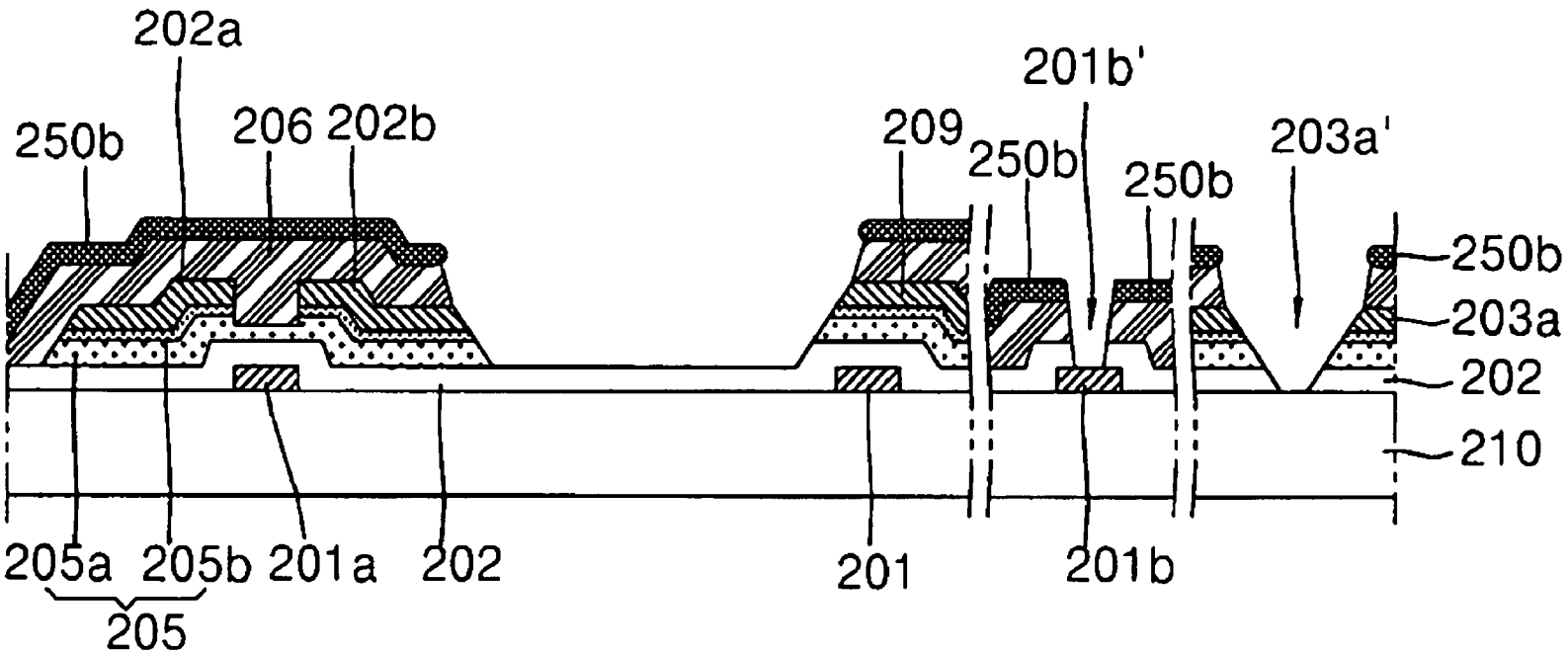

In FIG. 13C, the first PR pattern 250a may be removed through an ashing process. Accordingly, a portion of the second PR pattern 250b may also be removed to reduce a thickness of the second PR pattern. Then, the second insulating film 206 of the pixel region exposed by removing the first PR pattern 250a may be etched by the second PR pattern 250b used as a mask to expose a portion of the drain electrode 202b and a portion of the storage electrode 209 and, at the same time, to reveal the first insulating film 202 of the pixel region. At this time, the second insulating film 206 may be efficiently removed by dry etching. In addition, the etching process may continually progress after forming all of the desired patterns so that the second insulating film 206 may be over etched to protrude an edge region of the second PR pattern 250a.

Figure 13D:
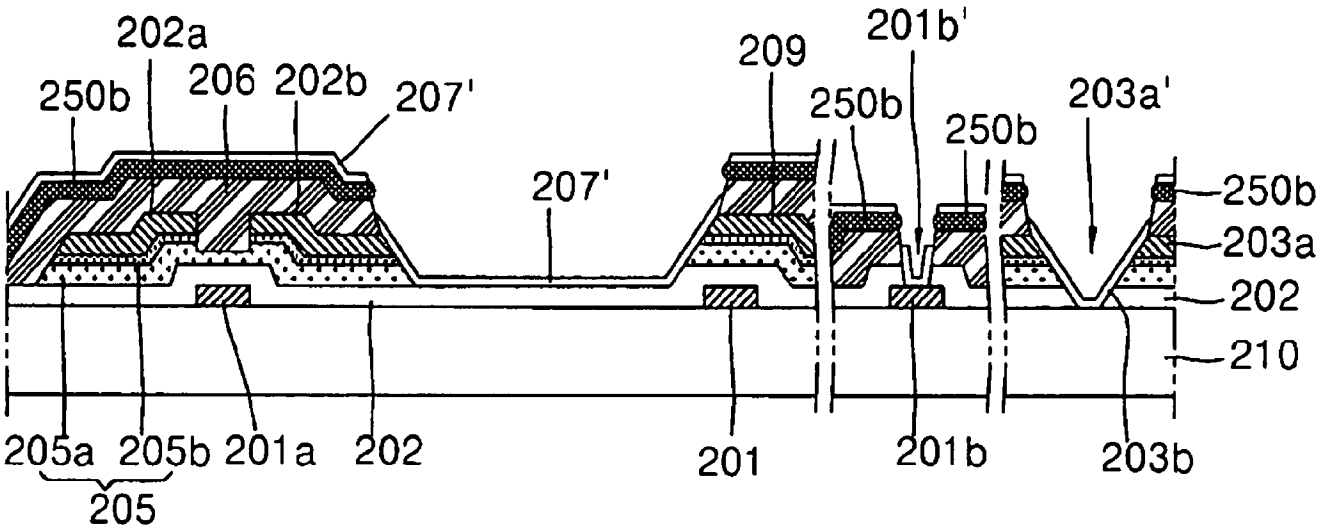
Figure 13E:
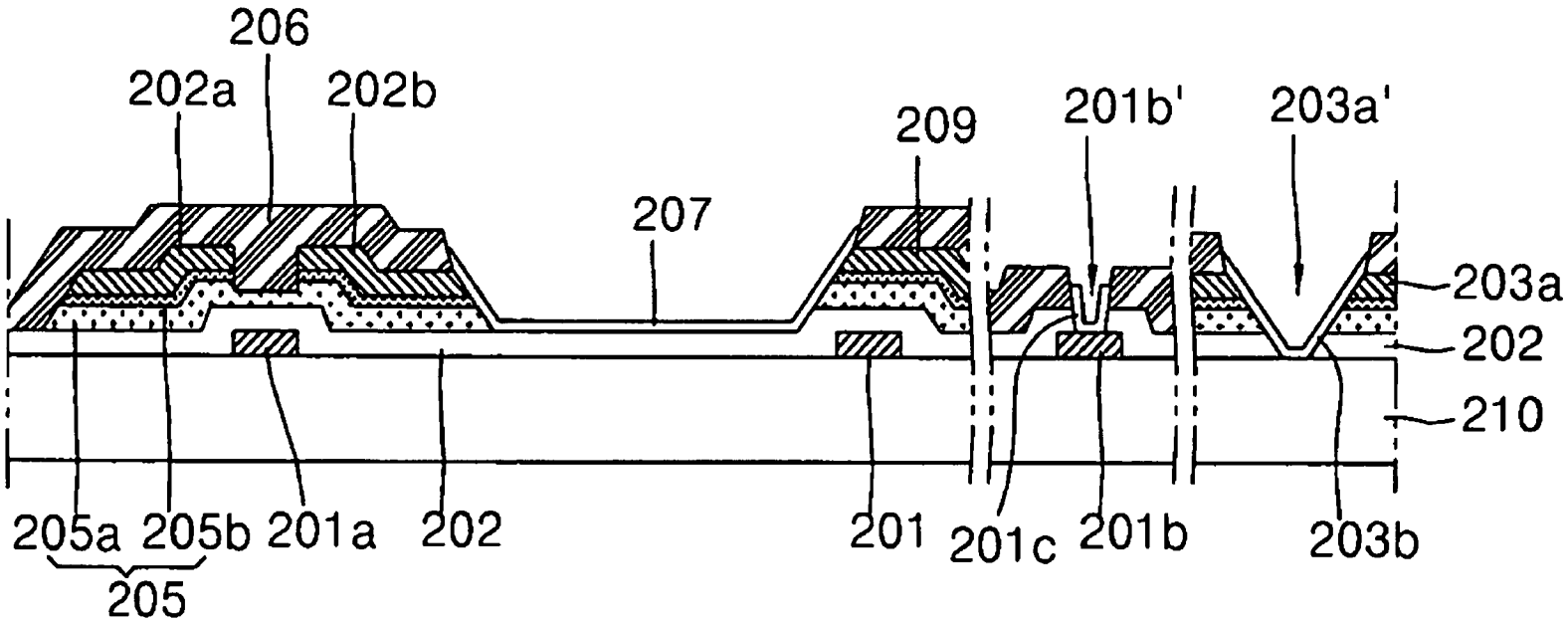

In FIG. 13D, a transparent conductive film 207', such as indium-tin-oxide (ITO) or indium-zinc-oxide (IZO), may be deposited along an entire surface of the substrate 210 including the second PR pattern 250a in which the edge region may protrude. Since the conductive film 207' may not be deposited on a lower portion of the edge region in the PR pattern 250a, this region may be exposed to an exterior. Subsequently, the second PR pattern 250a in which the edge region is partially exposed may be removed by a stripper and, at the same time, the conductive film 207' deposited on the second PR pattern 250a may also be removed together therewith to respectively form the pixel electrode 207 connected to the drain electrode 202b and the storage electrode 209 formed on the first insulating film 202 (i.e. the gate insulating film), as shown in FIG. 13E. Accordingly, a gate connection terminal 201c connected via the first contact hole 201b' to the gate pad 201b, and a data connection terminal 203b connected via the second contact hole 203a' to the data pad 203a may be simultaneously formed.

In addition, step heights formed at regions at which the pixel electrode 207 is connected to each of the drain electrode 202b and the storage electrode 209 may be formed due to the active layer 205a, the ohmic contact layer 205b, and the drain electrode 202b. Accordingly, the size of the step heights may be reduced, as compared with the size of the step heights shown in FIG. 12D. In other words, in FIG. 12D, the step heights of the pixel electrode 107 may be formed due to the gate insulating film 102, the active layer 105a, and the drain electrode 102b, whereas, in FIG. 13E, the pixel electrode 207 may be formed on the gate insulating film 202. Accordingly, the step heights due to the gate insulating film 202 may be removed.

According to the present embodiment, sizes of step heights of a pixel electrode may be reduced, thereby minimizing light leakage. In addition, since regions at which the light leakage is generated may be reduced, a size dedicated for forming a black matrix may be reduced, thereby improving aperture ratio. Furthermore, a storage capacitor may be formed by overlapping the pixel electrode and a gate line without individually forming a storage electrode at a capacitor region.

Figure 14:
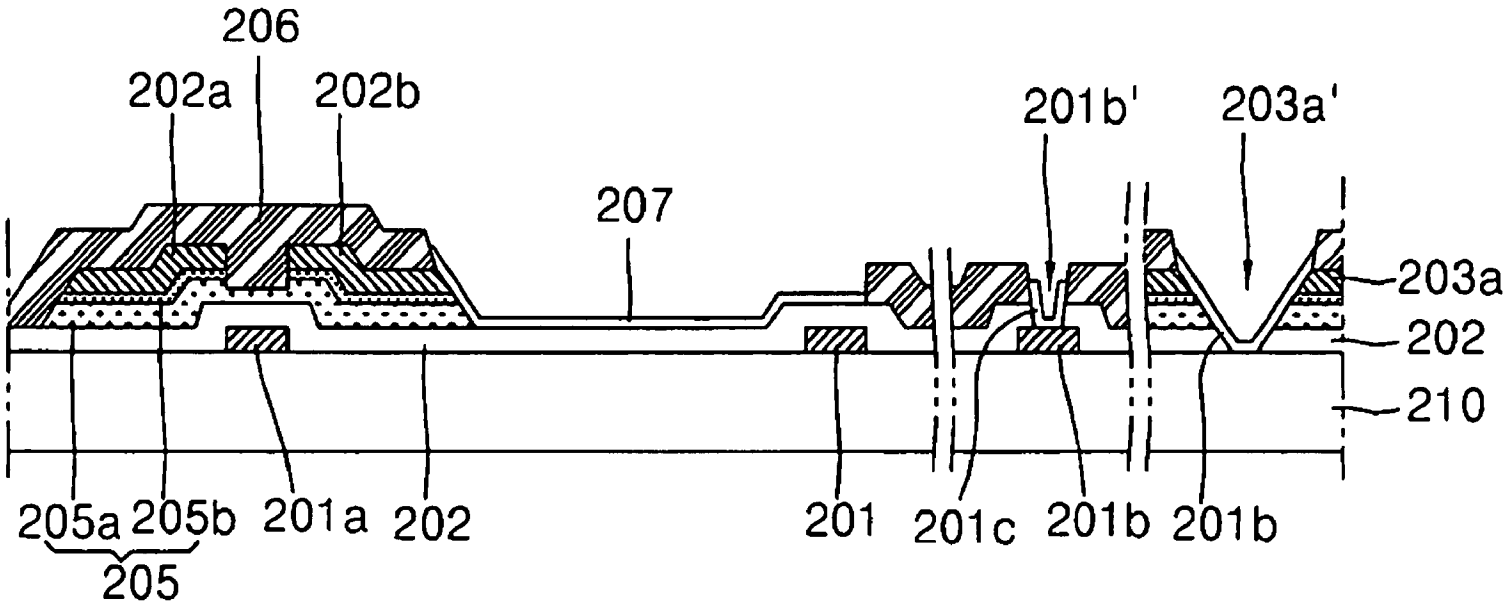
FIG. 14 is a cross sectional view of an exemplary storage capacitor according to the present invention.

FIG. 14 is a cross sectional view of an exemplary storage capacitor according to the present invention. In FIG. 14, a storage electrode may be omitted and a gate line 201 may be overlapped with a pixel electrode 207 with a gate insulating film 202 positioned therebetween to form a storage capacitor. Accordingly, when the storage capacitor is formed by directly overlapping the pixel electrode 207 with the gate line 201, it is possible to further efficiently reduce a step height of the pixel electrode 207 made at the region of the storage capacitor. In other words, as shown in FIG. 13E, reduction of the step height of the pixel electrode 207 was due to the storage electrode 209 and the semiconductor pattern (the active pattern and the n+ pattern) located at a lower portion of the storage capacitor 209. However, according to the present embodiment, since the storage electrode 209 is a factor resulting in the step height, and may be removed, then aperture ratio may be improved.

According to the present invention, a TFT array substrate and a method of fabricating a TFT array substrate may employ a three-round mask, thereby simplifying an arrangement of the substrate and fabrication process thereof. Thus, fabrication costs may be reduced and aperture ratio may be improved.

According to the present invention, a diffractive exposure mask or a half-tone may be used during a process of forming a passivation film and a pixel electrode to reduce step heights produced at regions in which the pixel electrode is connected to a drain electrode and a storage electrode. Thus, light leakage regions may be reduced and aperture ratio may to be improved.

According to the present invention, a transparent electrode formed on a PR pattern may be patterned by a stripping process for the PR pattern used in a patterning process of a gate insulating film and a passivation film. Since the transparent electrode pattern may be formed using a lift-off method, a total number of mask processes may be reduced.

It will be apparent to those skilled in the art that various modifications and variations can be made in the TFT array substrate and method of fabricating a TFT array substrate of the present invention without departing from the spirit or scope of the invention. Thus, it is intended that the present invention cover the modifications and variations of this invention provided they come within the scope of the appended claims and their equivalents.

What is claimed is:

1. A method of fabricating a thin film transistor array substrate, comprising:

forming a gate pattern on a substrate, the gate pattern including a gate electrode of a thin film transistor, a gate line connected to the gate electrode, and a lower gate pad electrode connected to the gate line *through a first mask process*;

forming a gate insulating film on the substrate having the gate pattern;

forming a source/drain pattern including a source electrode and a drain electrode of the thin film transistor, a data line connected to the source electrode and a lower data pad electrode connected to the data line, and a semiconductor pattern formed beneath the source/drain pattern there along *through a second mask process*; and forming a transparent electrode pattern and a passivation film pattern stacked on remaining areas except for areas at which the transparent electrode pattern is formed *through a third mask process*, wherein the transparent electrode pattern includes a pixel electrode directly contacting both the drain electrode and the semiconductor pattern *along sides of the drain electrode and the semiconductor pattern* and formed on the gate insulating film, [and the pixel electrode directly contacts] an upper gate pad electrode [and] *connected to* the lower gate pad electrode [along sides of the upper and lower gate pad electrodes], and [the pixel electrode directly contacts] an upper data pad electrode [and] *connected to* the lower data pad electrode [along sides of the upper and lower data pad electrodes].

2. The method according to claim 1, wherein the step of forming the transparent electrode pattern and the passivation film pattern includes:

forming a passivation film on the substrate having the source/drain pattern formed thereon;

forming a photo-resist pattern having a step height on the passivation film;

patterning the gate insulating film and the passivation film by using the photo-resist pattern to expose the lower gate pad electrode;

ashing the photo-resist pattern to expose the passivation film corresponding to the pixel electrode and the upper data pad electrode;

etching the exposed passivation film by using the ashed photo-resist pattern;

depositing a transparent material on the substrate having a residual photo-resist pattern; and removing the residual photo-resist pattern and the transparent electrode material on the residual photo-resist pattern to form a transparent electrode pattern.

3. The method according to claim 1, further comprising a storage capacitor including the gate line and a storage electrode overlapping the gate line with the gate insulating pattern and the semiconductor pattern positioned therebetween.

4. The method according to claim 3, wherein the step of forming the passivation film pattern includes partially exposing the drain electrode and the storage electrode to be connected to the pixel electrode.

5. A method of fabricating a thin film transistor substrate, comprising:

preparing a transparent substrate;

depositing a first metal film on the substrate and then forming a gate line, a gate electrode and a gate pad through a first mask process;

sequentially stacking a first insulating film, an amorphous silicon layer, an $n^+$ amorphous silicon layer and a second metal film on an entire surface of the substrate having the gate electrode and the gate line, and forming a data line vertically crossing the gate line and defining a pixel region together with the gate line, a semiconductor layer having an active layer and an ohmic contact layer, a source/drain electrode, and a data pad through a second mask process; and forming a second insulating film on an entire surface of the substrate having the data line and the source/drain electrode, exposing the first insulating film of the pixel region, the gate pad and the data pad [through a third mask process], depositing a transparent conductive film on an upper portion of the first insulating film, the gate pad and the data pad, to thereby form a pixel electrode directly contacting both the drain electrode and the ohmic contact layer *along sides of the drain electrode and the ohmic contact layer*, [directly contacting] a gate connection terminal [and] *connected to* the gate pad [along sides of the gate connection terminal and gate pad], and [directly contacting] a data connection terminal [and] *connected to* the data pad [along sides of the data connection terminal and data pad] *through a third mask process,*

*wherein the pixel electrode, the gate connection terminal and the data connection terminal are formed on remaining areas except for areas at which the second insulating film is formed*.

6. The method according to claim 5, wherein the second mask process includes:

applying a photo-resist film on the second metal film;

irradiating light to the photo-resist film through a mask having a partial exposure region partially transmitting the light and a transmission region entirely transmitting the light and a shielding region shielding the light;

developing the photo-resist film to which the light is irradiated through the mask to form a photo-resist pattern on the second metal film, wherein the photoresist pattern includes a first photo-resist pattern having a first thickness formed at the partial exposure region and a second photo-resist pattern having a second thickness formed at the transmission region;

etching the amorphous silicon layer, the n+ amorphous silicon layer and the second metal film by using the first and the second photo-resist patterns as masks to form the data line, the active layer, the ohmic contact layer and the data pad;

removing the first photo-resist pattern to expose a middle region of the second metal film formed on the ohmic contact layer; and removing portions of the second metal film and the ohmic contact layer by using the second photo-resist pattern as a mask to form the source/drain electrode.

7. The method according to claim 6, wherein a molybdenum silicide (MoSi) film is formed at the partial exposure region of the mask, and a chromium (Cr) film is formed at the shielding region.

8. The method according to claim 6, wherein the partial exposure region of the mask includes a slit.

9. The method according to claim 6, further comprising forming a storage electrode at the time of the formation of the source/drain electrodes, wherein the storage electrode overlaps the gate line to form a storage capacitor.

10. The method according to claim 5, wherein the first thickness of the first photo-resist pattern is less than the second thickness of the second photo-resist pattern.

11. The method according to claim 5, wherein the third mask process includes:

applying a photo-resist film on the second metal film;

irradiating light to the photo-resist film through a mask having a partial exposure region partially transmitting the light, a transmission region entirely transmitting the light, and a shielding region shielding the light;

developing the photo-resist film to which light is irradiated through the mask to form a photo-resist pattern on the second metal film, the photo-resist pattern including a first photo-resist pattern having a first thickness formed at the partial exposure region and a second photo-resist pattern having a second thickness formed at the transmission region;

etching the first and the second insulating films by using the first and the second photo-resist patterns as masks to form a first contact hole exposing the gate pad and a second contact hole exposing a lateral surface of the data pad;

removing the first photo-resist pattern;

removing the second insulating film of the pixel region by using the second photo-resist pattern as a mask to expose the first insulating film;

depositing the transparent conductive film along an entire surface of the substrate having the second photo-resist pattern, and removing the second photo-resist pattern and the transparent conductive film formed on the second photoresist pattern to form the pixel electrode, the gate connection terminal connected via the first contact hole to the gate pad, and the data connection terminal connected via the second contact hole to the data pad.

12. The method according to claim 5, further comprising forming a repair pattern at a lower portion of the data line.

13. The method according to claim 12, wherein the repair pattern is formed along with the gate line during the first mask process.

14. The method according to claim 5, wherein the transparent conductive film is made of one of indium-tin oxide (ITO) and indium-zinc-oxide (IZO).

15. The method according to claim 5, wherein the pixel electrode is formed to be overlapped with the gate line.

16. A method of fabricating a thin film transistor array substrate, comprising:

preparing a transparent substrate;

forming a gate line, a gate electrode, and a gate pad on the substrate *through a first mask process*;

forming a gate insulating film along an entire surface of the substrate having the gate electrode and the gate pad;

forming a data line to vertically cross the gate line and defining a pixel region together with the gate line, a semiconductor layer having an active layer and an ohmic contact layer, a source/drain electrode, and a data pad[, the data pad includes portions of the semiconductor layer and the ohmic layer] *through a second mask process*;

*forming a pixel electrode, a gate connection terminal and a data connection terminal on remaining areas except for areas at which a passivation film is formed through a third mask process;*

*wherein a third mask process comprises:* exposing the gate insulating film formed at each pixel region;

forming a passivation film along an entire surface of the substrate having the data line and the source/drain electrode;

applying a photo-resist film to an upper portion of the passivation film;

forming a photo-resist pattern on the passivation film by using a mask;

forming a contact hole exposing each of the gate pad and the data pad by using the photo-resist pattern as a mask for etching, and exposing the gate insulating film of the pixel region;

depositing a transparent conductive film along an entire surface of the substrate having the photo-resist pattern, the gate insulating film of the pixel region and the contact hole;

removing the photo-resist pattern and the transparent conductive film formed on the photo-resist pattern to form a pixel electrode directly contacting the gate insulating film of the pixel region parallel to the entire surface of the substrate, and forming a gate connection terminal and a data connection terminal respectively connected via the contact hole to the gate pad and the data pad[, the data connection terminal contacting the side regions of the portions of the semiconductor layer and the ohmic contact layer of the data pad].

17. The method according to claim 16, wherein the pixel electrode is formed to be overlapped with the gate line.

18. The method according to claim 16, further comprising forming a storage electrode overlapping the gate line when the source/drain electrodes are formed.

19. The method according to claim 16, wherein the step of forming the data line, the semiconductor pattern having the active layer and the ohmic contact layer, the source/drain electrodes, and the data pad includes:

sequentially stacking an amorphous silicon layer, an n+ amorphous silicon layer, and a metal film on the gate insulating film;

applying a photo-resist film on the metal film;

irradiating light to the photo-resist film through a mask, the mask having a partial exposure region partially transmitting the light and a transmission region entirely transmitting the light and a shielding region shielding the light;

developing the photo-resist film to which light is irradiated through the mask to form a photo-resist pattern on the metal film, the photo-resist pattern including a first photo-resist pattern having a first thickness formed at the partial exposure region and a second photo-resist pattern having a second thickness formed at the transmission region;

etching the amorphous silicon layer, the n+ amorphous silicon layer, and the metal film by using the first and the second photo-resist patterns as a mask to form the data line, the active layer, the ohmic contact layer, and the data pad;

removing the first photo-resist pattern to expose a middle region of the metal film formed on the ohmic contact layer; and removing a part of the metal film and the ohmic contact layer by using the second photo-resist pattern as a mask to form the source/drain electrodes.

20. The method according to claim 19, wherein the first thickness of the first photo-resist pattern is less than the second thickness of the second photo-resist pattern.

21. The method according to claim 16, wherein forming the photo-resist pattern on the passivation film includes:

applying a photo-resist film on the passivation film;

irradiating light to the photo-resist film through the mask, the mask having a partial exposure region partially transmitting the light and a transmission region entirely transmitting the light and a shielding region shielding the light;

developing the photo-resist film to which light is irradiated through the mask to form a photo-resist pattern on the passivation film, the photo-resist pattern including a first photo-resist pattern having a first thickness formed at the partial exposure region and a second photo-resist pattern having a second thickness less than the first thickness formed at the transmission region.

22. The method according to claim 21, wherein a portion of the gate insulating film and a portion of the passivation film are etched by using the first and the second photo-resist patterns as masks to form contact holes for exposing the gate pad and the data pad, removing the first photo-resist pattern, and removing the passivation film of the pixel region by using the second photo-resist pattern as a mask to expose the gate insulating film of the pixel region.

23. The method according to claim 22, wherein the first photo-resist pattern is removed through an ashing process.

24. The method according to claim 21, wherein the photo-resist pattern includes the second photo-resist pattern.

*25. The method according to claim 16, wherein the data pad includes portions of the semiconductor layer and the ohmic layer, and wherein the data connection terminal contacting the side regions of the portions of the semiconductor layer and the ohmic contact layer of the data pad.*

* * * * *